United States Patent [19]
Tani

[11] Patent Number: 5,802,970
[45] Date of Patent: Sep. 8, 1998

[54] SCREEN PRINTING APPARATUS

[75] Inventor: Okie Tani, Tokyo, Japan

[73] Assignee: Tani Electronics Industry Co., Ltd, Tokyo, Japan

[21] Appl. No.: 609,628

[22] Filed: Mar. 1, 1996

[30] Foreign Application Priority Data

| Mar. 1, 1995 | [JP] | Japan | 7-081656 |
| Oct. 7, 1995 | [JP] | Japan | 7-296349 |
| Nov. 17, 1995 | [JP] | Japan | 7-335632 |

[51] Int. Cl.⁶ .................................................. B41L 13/18
[52] U.S. Cl. ............................................................ 101/123
[58] Field of Search .................................. 101/114, 123, 101/129, 124; 118/241, 242, 256

[56] References Cited

U.S. PATENT DOCUMENTS

| 4,307,662 | 12/1981 | Mitter | 101/123 |
| 5,287,806 | 2/1994 | Nanzai | 101/123 |
| 5,309,837 | 5/1994 | Nanzai | 101/425 |
| 5,452,655 | 9/1995 | Tani | 101/123 |
| 5,522,929 | 6/1996 | Erdmann | 101/123 |

FOREIGN PATENT DOCUMENTS

| 0 626 259 | 11/1994 | European Pat. Off. |
| 1-19275 | 4/1989 | Japan . |
| 6-210829 | 8/1994 | Japan . |
| 1135819 | 12/1968 | United Kingdom . |

*Primary Examiner*—Ren Yan
*Attorney, Agent, or Firm*—Foley & Lardner

[57] ABSTRACT

A screen printing apparatus for printing solder, conductive ink, etc. on an insulating substrate. The screen printing apparatus including synchronized extruding, agitating and squeegee mechanisms for consistent, accurate and rapid printing.

11 Claims, 20 Drawing Sheets

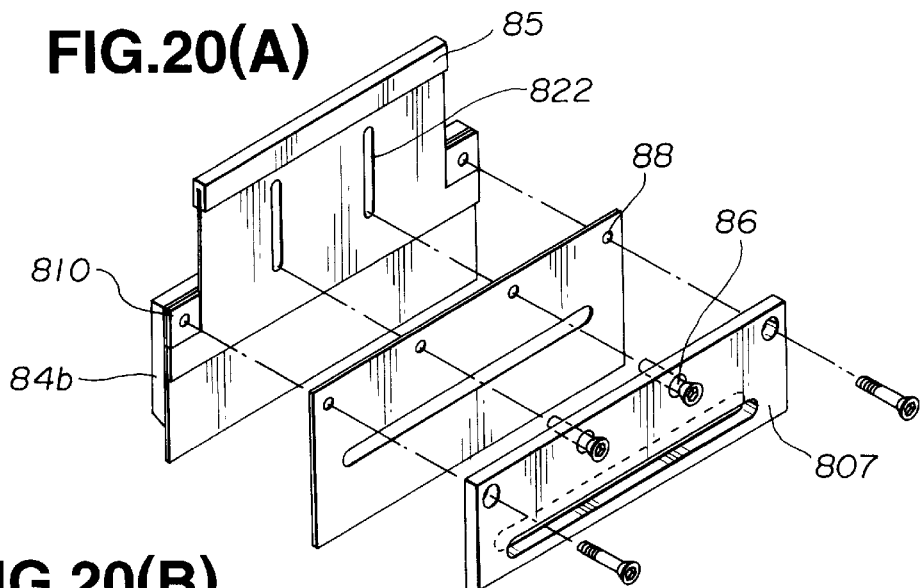
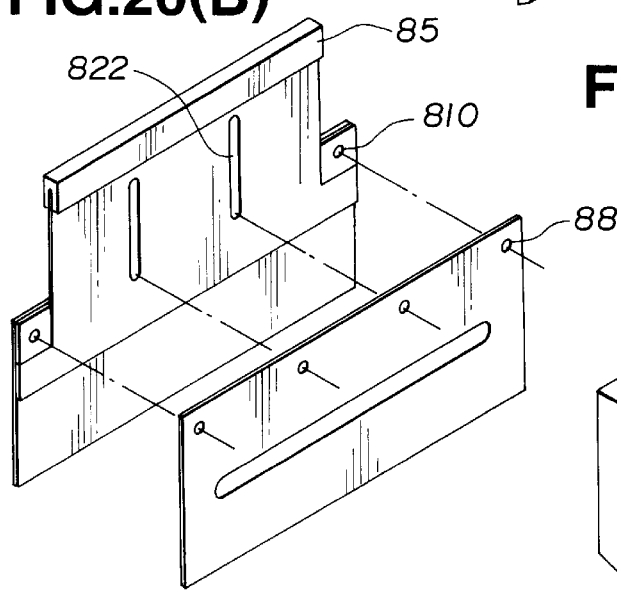
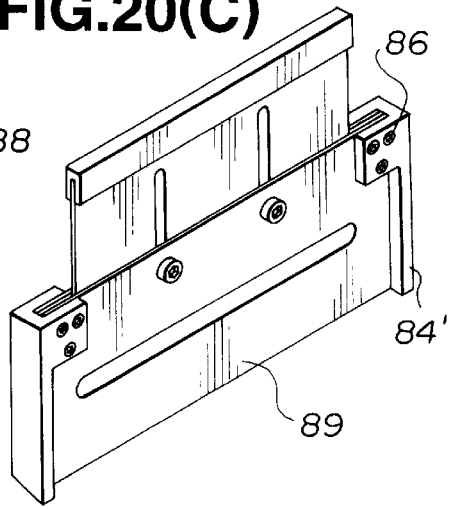
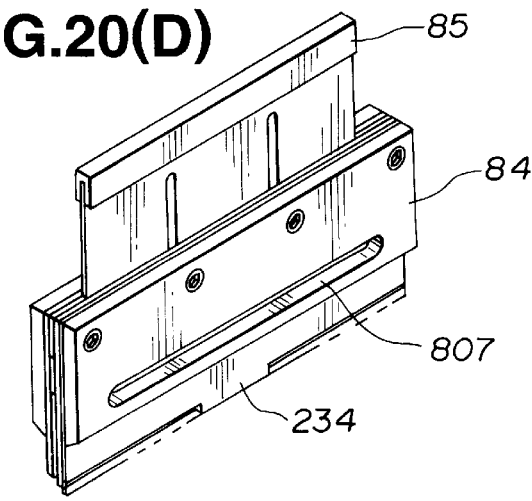
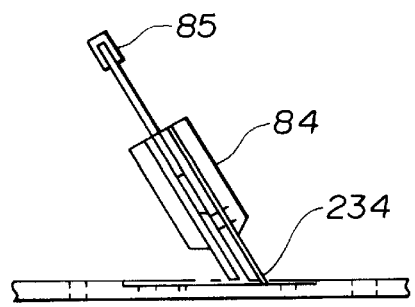

4025

4026

4026c

4025r

SCREEN PRINTING APPARATUS

BACKGROUND OF THE INVENTION

1. Field of the Invention

The present invention relates to a screen printing apparatus. Specifically the present invention relates to a device for screen printing of solder, etching compounds, or the like, utilized in the manufacture of electronic components (i.e. printed circuits, etc.)

2. Description of the Related Art

For printing electric circuit patterns on an insulating base board, a so-called "screen printing" has been hitherto used. The printing system employed in this printing comprises generally a screen (or mesh) plate which is put on an insulating base board to be printed, and a squeegee (viz., ink squeezing device) which runs on the screen plate while squeezing a given amount of viscous conductive compound, such as solder or conductive ink, etc., onto the screen plate and pressing the screen plate against the insulating base board. With this a desired circuit pattern of the conductive ink is printed on the surface of the insulating base board, which pattern coincides with a perforated print pattern defined by the screen plate. The base board thus printed is then removed from the screen plate and heated for fixing the printed circuit pattern. The screen plate is constructed of a stainless steel mesh or the like.

A screen printing plate and a mask plate are used for applying such a conductive compound on a circuit substrate. Squeegee arrangements commonly employed for such operations include an open type and an enclosed type which includes a housing portion.

Such a conventional screen printing devices as described above has been disclosed for example, in Japanese Patent Application First printing No. 19275/1989.

However, according to such conventional screen printing arrangement, there remain drawbacks.

For example, according to the requirements of modern manufactured electronic components, a circuit density is quite high. That is very thin connective lines of the circuit pattern which must be printed by the screen printing apparatus reliably, preferably at high speed and low cost.

Mainly, in such enclosed type printing apparatus, printing is carried out by supplying a printing material to a chamber having the mesh screen at a lower side thereof under pressure. The material is there agitated and kneaded to maintain sufficient viscosity of the material which is supplied to and excess retrieved from a squeegee opening. The temperature of such a printing chamber is controlled and sealed with an inert gas.

However, effecting printing of circuits by such an enclosed squeegee apparatus is difficult since a required pitch for such circuit type screen printing apparatus may be extremely fine and with a high density of printed lines. Because of the high density and fine pitch required of modern printed circuits, and other factors such as providing a high density conductive plating having a fine pitch width remain to be solved.

In addition, since a desired circuit pattern of the conductive ink is printed on the surface of the insulating base board, which pattern coincides with a perforated print pattern defined by the screen plate. The base board thus printed is then removed from the screen plate and heated for fixing the printed circuit pattern. The screen plate is constructed of a stainless steel mesh or the like.

For improving the quality of the printed pattern on the base board, it is necessary to clean the screen plate at certain intervals. Hitherto, various cleaning devices have been proposed and put into practical use for such purpose. However, due to their inherent construction, a satisfactory cleaning effect is difficult to obtain and also such clean apparatus tend to be costly.

Also, in such screen printing processes for printing of circuits etc., a screen printing plate and a mask plate are used for applying the printing material onto the substrate according to the predetermined image pattern. Such screen printing plates are commonly of the metal type or alternatively the mesh type. A squeegee device frequently used are the above mentioned, enclosed or open type squeegee assemblies.

The present invention further relates to a squeegee blade for effecting such screen printing operations according to the method of the invention.

Since fine-pitch narrow patters are requested for printing, the size of a grain of a printing material becomes finer. Therefore, it is difficult to print narrow patters owing to diversification of pattern surfaces, substrate material, and printing material. It also becomes difficult to stably and continuously print mixed patters consisting of narrow and wide patterns.

When using a metal squeegee blade on a mesh screen or a very thin metal screen, the following problem are commonly encountered; 1) damage to a main surface of the printing plate at front and rear ends thereof inflicted by movement of the squeegee blades extending in a transverse direction to a printing direction across the width of the screen plate; 2) imperfections caused by residual printing material left on the screen plate after printing due to the low viscosity of some of the printing material used in such screen printing operations (i.e. solder or the like); 3) unevenness of printing pressure at concave portions of a printing screen, or when so-called 'half pitch' screen printing plates are utilized having more than one depth of pattern formed thereon to be printed; 4) residual printing material remaining on a printed article or conversely, printed areas of the article having the printing material removed therefrom by passage of a squeegee blade, particularly with fine pitch printed areas; 5) abrasion of the squeegee blade material particularly if the printing material utilized is very hard, thus it becomes difficult to assure consistency of printing results and further, problems occur in terms of energy saving, frequency of blade replacement, and stable production speed and quality; and 6) arriving at a suitable structure for a squeegee blade according to operations when a printed surface of a single article requires that mixed wide, narrow, large and small patterns be printed.

SUMMARY OF THE INVENTION

It is therefore an object of the present invention to provide a screen cleaning device for use in the screen printing, which is free of the drawbacks of the related art.

It is further an object of the invention to provide a method of screen printing and apparatus therefor which can effect reliable and high speed circuit printing in which cleaning operation is reliably assured.

According to a first aspect of the present invention, there is provided an enclosed squeegee type screen printing method, comprising: surrounding a viscous printing material with a wall; supplying and retrieving the printing material from the wall; an openably and closably controllable squeegee mechanism, agitating means active to agitate the printing material when the squeegee mechanism is in an open condition; printing extrusion mechanism formed as part of the agitating mean; and control means for synchronizing the printing, agitating, extruding and supplying operations.

According to a another aspect of the present invention, there is provided an enclosed squeegee type screen printing apparatus, comprising: a printing chamber including a wall portion for sealingly surrounding a viscous printing material; supplying and retrieving the printing material from the wall; an openably and closably controllable squeegee mechanism; agitating means active to agitate the printing material when the squeegee mechanism is in an open condition; printing extrusion mechanism formed as part of the agitating mean; and control means for synchronizing the printing, agitating, extruding and supplying operations.

According to a third aspect of the present invention, there is provided an enclosed squeegee blade arrangement for a screen printing apparatus, comprising: plurality of squeegee blades held together in a layer structure, the squeegee blades being formed of a substantially rigid material having thin sharp edge portions; a leading edge of the plurality of squeegee blades being specifically configured to enhance screen printing via a printing plate over which the squeegee blade arrangement is passed for effecting screen printing.

According to still another aspect of the present invention, there is provided a A squeegee blade arrangement for a screen printing apparatus, comprising: a plurality of squeegee blades layered together along a direction perpendicular to a printing direction, each of the plurality of squeegee blades being formed of a substantially rigid material and including substantially sharp edge portions, the plurality of layer blades being joined together as a single unit for effecting screen printing.

A screen printing method utilizing a squeegee blade arrangement for a screen printing apparatus, comprising: providing a plurality of squeegee blades disposed in parallel in a direction substantially transverse to a printing direction for effecting screen printing via a printing material supplied to the squeegee blades according to sliding contact of the squeegee blades across a first surface of a screen plate; and arranging the plurality of squeegee blades in a spaced apart manner having hollow chambers respectively provided between each of the squeegee blades and an adjacent one of the plurality of squeegee blades.

In addition, according to a fifth aspect of the invention, there is provided a A squeegee blade arrangement for a screen printing apparatus, comprising: a plurality of squeegee blades disposed in parallel in a direction substantially transverse to a printing direction for effecting screen printing via a printing material supplied to the squeegee blades according to sliding contact of the squeegee blades across a first surface of a screen plate; and the plurality of squeegee blades in a spaced apart manner having hollow chambers respectively provided between each of the squeegee blades and an adjacent one of the plurality of squeegee blades.

BRIEF DESCRIPTION OF THE DRAWINGS

The objects and advantages of the present invention will be apparent from the following description taken in conjunction with the accompanying drawings. In the Drawings:

FIG. screen plate 1A is a schematic illustration of a screen printing apparatus according to a first preferred embodiment of the present invention;

FIG. 20A is an exploded perspective view of the plate portion of the squeegee of FIGS. 19A and 19B;

FIG. 20B is an exploded perspective view of a first component of the plate portion according to the alternative squeegee structure of the invention;

FIG. 20C is an exploded perspective view of a second component assembled on the first component for forming the structure of the plate portion of the alternative squeegee structure of the invention;

FIG. 20D is an exploded perspective view of another assembly of the plate portion according to the invention;

FIG. 20E is a cross-sectional view of the assembled plate portion of the squeegee structure according to the invention;

DESCRIPTION OF THE PREFERRED EMBODIMENT

Figure 1A:
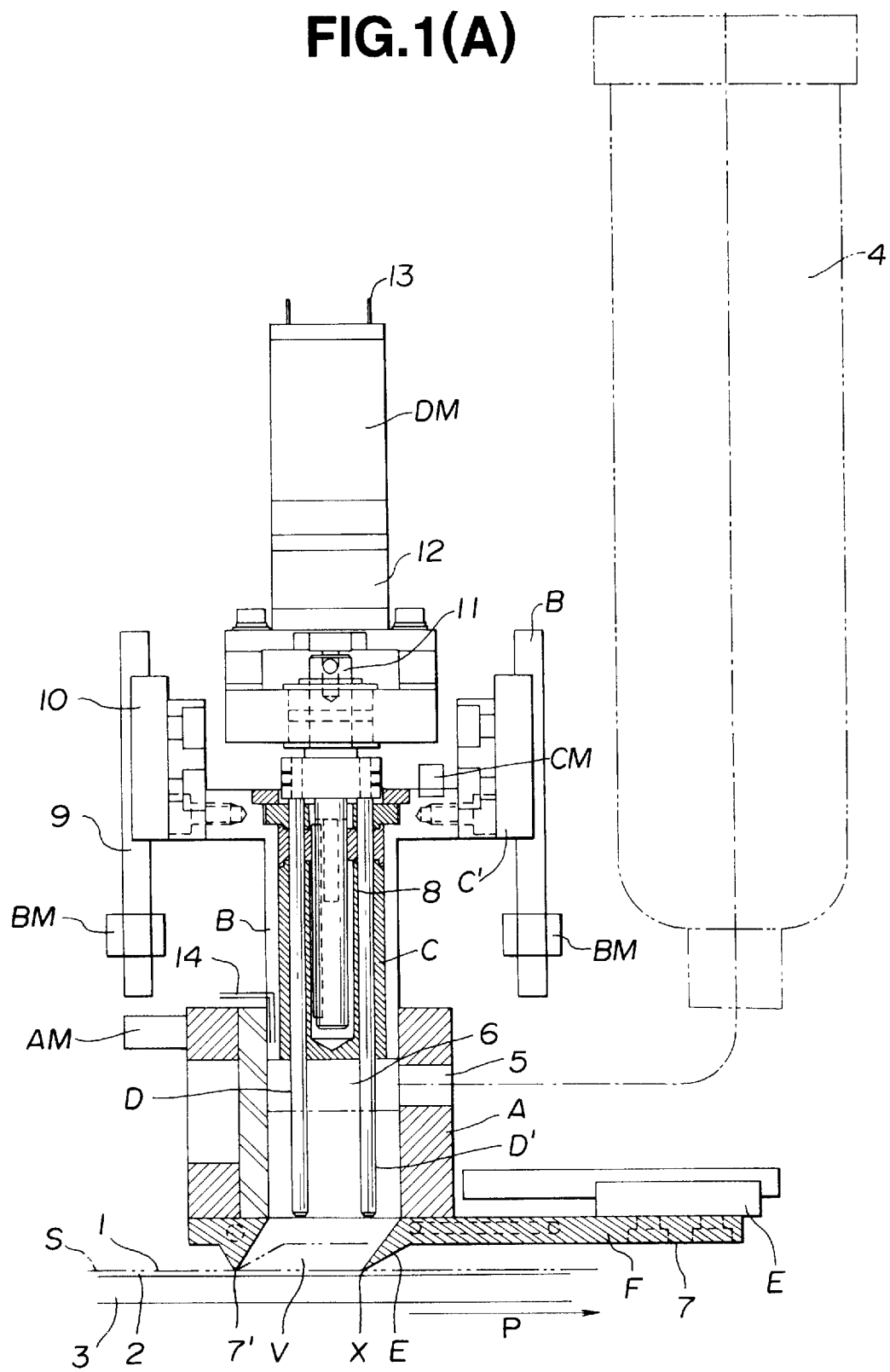
FIG. 1B is a schematic illustration of a screen printing apparatus according to a second preferred embodiment of the present invention.

Hereinbelow, a preferred embodiment of the invention will be explained in detail with reference to the drawings.

The present invention set out to solve the problems of the related art by a changed structure of printing apparatus as will be disclosed herein. Further, the printing condition setting method, operating mechanism and the manner in which the housed printing apparatus is controlled are newly introduced for effecting continuous high density printing accurately by way of an enclosed squeegee structure.

First, a new mechanism of a housing chamber is disclosed. Referring to FIG. 1 A this includes a vertically moving top lid portion B having a lower cylindrical portion B' closely contacting an inner peripheral wall of the printing chamber 6 provided in the enclosed squeegee printing base A. A vertically movable cylindrical rotary portion C is mechanized on the vertically moving top lid portion B, mechanically driven on the vertically moving top lid portion B and one or more vertically movable rotary bars D are provided on the vertically movable cylindrical rotary portion C.

Further, control means may be implemented for accurately controlling action of the printing material (i.e. solder) in the printing chamber 6 by interlocking engagement of the above mechanisms. The printing chamber 6 is formed with a lower squeegee setting cassette 7 having a leading edge 7a and a trailing edge 7b and including a chamber opening stopper member X. The squeegee setting cassette 7 includes a V-shaped opening V designed to open and close when the squeegee is moved to make sliding contact with a screen plate 1 screen plate top surface 1a by provision of a printing base lower support portion 3 at a lower side corresponding to a screen plate lower surface 1b of the screen plate 1.

The printing base lower support portion 3 receives the load applied to the printing chamber 6 for effecting screen printing operation.

Rigid squeegees 8 are utilized for further controlling pressure in the printing chamber 6. By utilizing such rigid squeegees 8, the pressure of the printing load is never applied directly to the screen plate 1. Because the printing load of the printing chamber 6 is not applied to the screen plate 1, damage to the screen plate 1 according to being subject to pressure is avoided. The printing load is applied to the screen plate only at a position at which the squeegee is brought into contact with the surface of the screen plate via the V-shaped printing opening V, this may be referred to as a secondary printing load. Further, the printing load may be adjusted according to the structure of the screen plate. Thus, substantially thin plate material may be used for forming the screen plate 1 allowing fine pitch high density printing to be realized.

Moreover, such control is also available in a case where a substantially thick screen plate 1 is utilized due to extrusion action carried out by the vertically moving top lid portion B. The lower cylindrical portion is provided at a top side of the printing chamber 6 and the vertically movable cylindrical rotary portion C having a vertically movable rotary bars D is provided at a lower side of the vertically movable body of vertically moving top lid portion B and one or more vertically movable rotary bars D are provided the vertically movable cylindrical rotary portion C to form a control mechanism for performing printing by controlling operation of these portions as necessary.

Further, control operation of the above portions is synchronized with opening and closing of the 8 provided at the lower side of the printing chamber 6 for effecting printing operation. For example, printing operations require closely timed actions such as kneading at the time of squeegee closing, supplying and kneading at the time of squeegee opening, and returning printing material at the time of starting of closing of the 8.

Since, according to the structure of the present invention the vertically moving top lid portion B sits sealingly upon the enclosed squeegee printing base A acting as a piston and cylinder. Accordingly, sealing of the printing chamber printing chamber 6 is assured even with movement of the vertically moving top lid portion B. Further, according to such structure, pressure of the printing chamber printing chamber 6 may be precisely controlled and dispersion of the printing material is avoided thus allowing fine pitch high density printing to be realized with uniform thickness of a printed area. Further the chamber printing chamber 6 is sealed and can therefore be pressurized with an inert gas, such as nitrogen, for example, for preventing activation of the solder and promoting long term continuous printing operation by the apparatus.

According to the invention, the individually controlled vertically moving top lid portion B, vertically movable cylindrical rotary portion C, and vertically movable rotary bars D are provided in an integrated assembly based on the vertically moving top lid portion B which is set into the top of the enclosed squeegee printing base A as a single assembly, or cassette-like mechanism allowing such a screen printing apparatus to be compact and straight forward in design. Various combinations of the above components are possible within the scope of the invention as herein disclosed.

Further, According to the present embodiment each of the enclosed squeegee printing base A, vertically moving top lid portion B, vertically movable cylindrical rotary portion C and vertically movable rotary bars D are provided with respective driving units or motors. Specifically, the enclosed squeegee printing base A is provided with an enclose squeegee printing base power unit AM, the vertically moving top lid portion B with a top lid driving power unit CM, vertically movable cylindrical rotary portion C with a rotary portion driving power unit CM and vertically movable rotary bars D with a rotary bar driving power unit DM. However, according to the invention it will be noted that a single power source may be tapped for providing various energies required for control operation of the enclosed squeegee printing base A, vertically moving top lid portion B, vertically movable cylindrical rotary portion C, and vertically movable rotary bars D via provision of appropriate interlocking or gearing mechanisms.

As may also be seen in FIG. 1A, the enclosed squeegee printing base A is provided with a supply port 5 in connection with a supply source 4 (i.e. a solder replenisher) to effect replenishment of the solder (or other printing material) according to requirements. It has been noted that the squeegees 8 are rigidly formed. A blade of such rigid squeegees 8 are made to be substantially sharp for effecting clean printing. However, alternatively, roller type squeegee may also be utilized according to the structure of the invention.

In addition, a heat exchange unit 20 is provided at an inner wall of the printing chamber 6 while a control unit therefor may be provided, for example, at an outer wall of the enclosed squeegee printing base A such that suitable control of the temperature of the solder may be effected.

Further, a gas control portion including a gas supply inlet 14 is provided for providing an inert gas such as nitrogen to the sealed chamber printing chamber 6 for preventing the solder from degrading with age such that long term continuous printing may be reliably consistent.

Further, since such high density, fine pitch printing operations must assure high quality, a squeegee control portion E may further be interlocked with the above described apparatus The squeegee control portion E may be attached to one side of the enclose squeegee printing base A and provided with a motor portion, or a squeegee control driving power unit EM similarly to the other portions or, as previously mentioned, a single power source may be tapped for providing required power for control operation of the enclosed squeegee printing base A, vertically moving top lid portion B, vertically movable cylindrical rotary portion C, vertically movable rotary bars D and squeegee control portion E via provision of appropriate interlocking or gearing mechanisms.

Further, since monitoring and inspection of such fine pitch printing is required. A monitoring unit may further be attached downstream of a printing position since simultaneous printing and inspection are difficult for various reasons. The monitoring unit may be provided attached to the enclosed squeegee printing base A for carrying out inspection of a printed surface immediately after printing such that a feedback control means is provided for allowing continuous monitoring and adjustment of the printing characteristics.

Also, although electric motors are utilized according to the embodiment, it is alternatively possible to provide such a mechanism utilizing hydraulic pressure or air pressure, etc.

According to the structure of the solder printing apparatus as set forth above, new problems facing circuit component printing are solved. Among these are the problems of sealing and airtightness of a printing chamber 6, maintaining of the printing material in a deactivated state is assured by the gas control provisions, kneading and agitation of the printing material in synchronous operation with a printing cycle may be assured, a desired temperature of the printing chamber 6 may be reliably maintained and viscosity control of solder and the like is simplified as well as supplying and returning the material to and from the 4. In addition, fine adjustment of pressure, a charging quantity of printing material, hardness and shape control of printing and changing printing conditions as well as damage to a printing surface and the like may be optimized according to interlocking provision of the squeegee control portion E as set forth above.

Referring again to FIG. 1A, a profile of an essential portion of the apparatus of the embodiment is shown for explaining the screen printing method according to the invention. The drawing represents a cross-sectional view of the main component enclosed squeegee printing base A of the printing device along a printing direction P. In FIG. 1A, screen printing screen plate 1 is cooperated with an enclosed squeegee component enclosed squeegee printing base A. A vertically moving top lid portion B is provided which moves vertically relative the enclosed squeegee printing base A with sliding contact of an inner wall portion of the enclosed squeegee printing base A. A vertically movable cylindrical rotary portion C is provided, at the vertically moving top lid portion B which moves in a vertically sliding manner with contact of a lower cylindrical portion B' inner wall portions of the printing chamber 6. Vertically movable rotary bars D are disposed at the vertically movable cylindrical rotary portion C and are vertically movable relative to the vertically movable cylindrical rotary portion C and active to agitate and knead the printing material within the printing chamber 6 such that a required viscosity thereof may be maintained. Squeegees 8 are positioned at the lower side of the enclosure formed by the housing of the enclosed squeegee printing base A. This structure may be formed as a modular component such as a cassette type unit (i.e. the squeegee setting cassette 7).

Further, as seen in FIG. 1A, driving power units are provided for operating the above-described components. A motor, or enclosed squeegee printing base power unit AM is provided for the enclosed squeegee printing base A, while a top lid driving power unit BM is provided for the vertically moving top lid portion B, a rotary portion driving power unit CM controls operation of the vertically movable cylindrical rotary portion C. Similarly, a rotary bar driving power unit DM is provided for controlling moving operations of the vertically movable rotary bars D.

Figure 2:
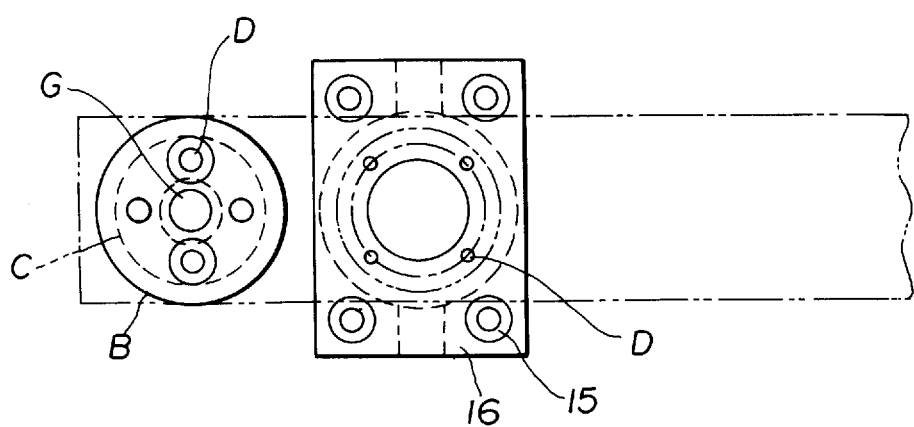
FIG. 2 is a schematic top view of essential portions of the of a screen printing device according to the invention.

It will be noted that the vertically moving top lid portion B is movable along vertical housing guides 9 via guide shoes 10. Referring now to FIG. 2 in which a top view of the vertically moving top lid portion B and the vertically movable cylindrical rotary portion C are shown, a motor acting as the rotary bar driving power unit DM may be attached to an upper side to the vertically moving top lid portion B via installation bolts 15 or the like, a motor shaft G thereof being accommodated within the vertically movable cylindrical rotary portion C. Further, it will be noted that a driving motor setting base 16 is provided for the vertically moving top lid portion B.

It will further be noted from the drawings that a printing chamber 6 is defined at an inner wall portion of the enclosed squeegee printing base A. The printing chamber 6 receives the printing material, such as a conductive viscous compound (i.e. solder) for circuit printing, from a supply source 4 via a supply port 5.

According to this structure the rotary bar driving power unit DM of the vertically movable rotary bars D may be an agitator motor or the like for kneading and agitate the printing material to maintain favorable flow thereof. Further the vertically movable rotary bars D may be controlled independently depending on an open or closed condition of the squeegee. Further, the vertically movable cylindrical rotary portion C is active to vertically move the vertically movable rotary bars D according to given operational conditions so as to knead, agitate and extrude the printing material during printing. The vertically moving top lid portion B of the enclosed squeegee printing base A supplies printing material to the printing chamber 6 through to the 1a of a screen plate 1 by peripherally contacting the inner wall of the printing chamber 6 and moving downward to the surface of the screen. After printing is completed the vertically moving top lid portion B is controlled to rise when the squeegee opens for returning excess printing material. In case of fine pitch high density printing the above described recovery means is effective to improve printing quality substantially since residue left on the screen plate can greatly deteriorate overall printing quality.

The vertically movable cylindrical rotary portion C is also controlled as described above.

The squeegee control portion E is controlled by an squeegee control driving power unit EM simultaneously and printing operation is carried out by controlling the vertically moving top lid portion B, vertically movable cylindrical rotary portion C, and vertically movable rotary bars D together with squeegee control portion E.

Moreover, in the present apparatus, the lower cylindrical portion of the vertically moving top lid portion B acts as a shut off chamber of the apparatus preventing leakage of the printing material.

The squeegee or squeegees 8 are set into a squeegee setting cassette 7 having a leading edge 7a and a trailing edge 7b. At a lower side of the printing chamber 6 the squeegee setting cassette 7 includes a chamber opening stopper member X thus preventing excessive pressure being applied to the screen plate 1. Further, the combination of the squeegee setting cassette 7, the printing chamber base support portion 3 and the chamber opening stopper member X with controlled movement of the squeegee blade assembly 8 assures precise control over printing quality.

Figure 1B:
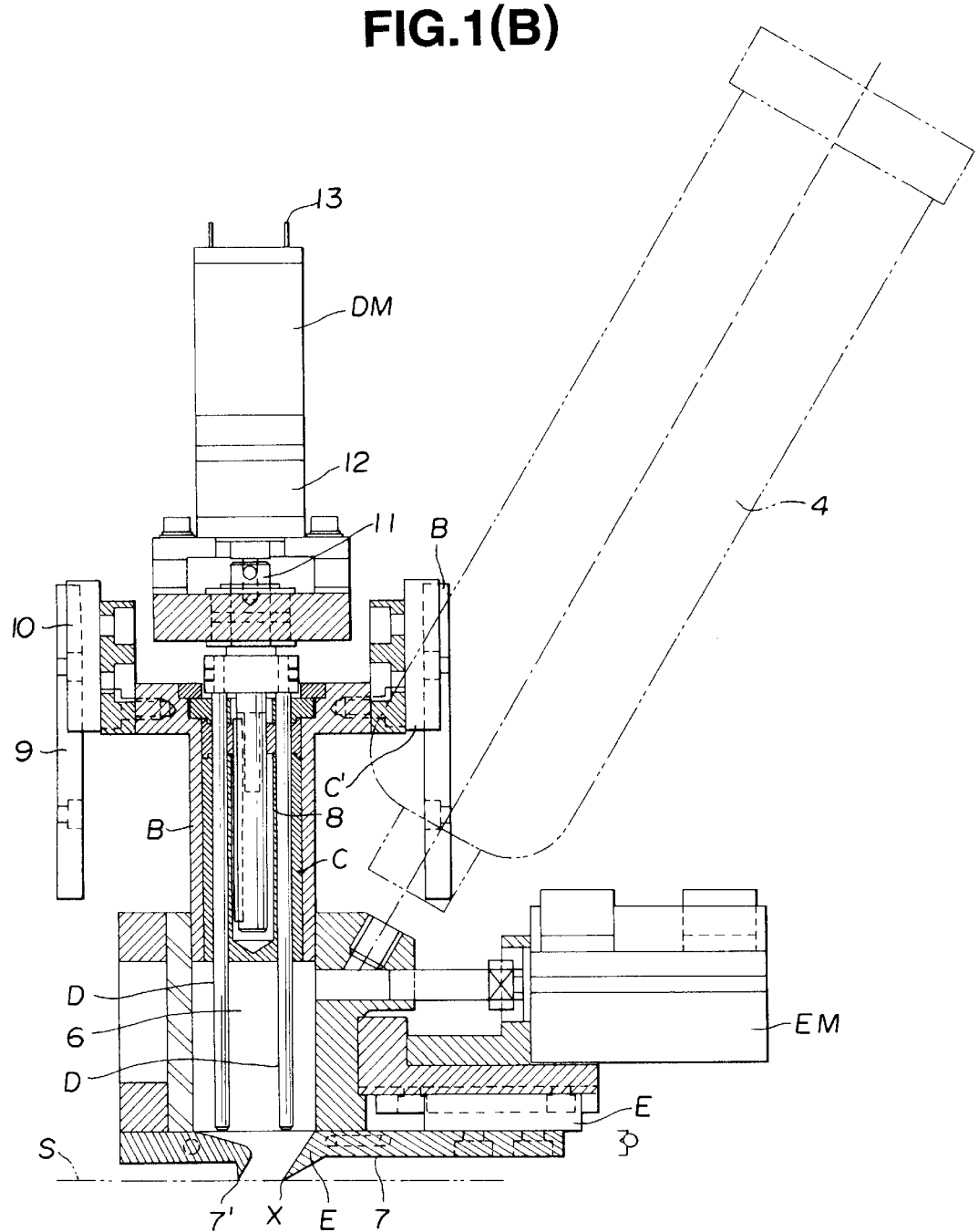

FIG. 1B illustrates a schematic view of an alternative construction of a screen printing apparatus according to the invention. For clarity, like reference numeral will be used to describe like parts in the following description. As will be appreciated from FIG. 1B, the apparatus of the second embodiment includes a vertically moving top lid portion B having a lower cylindrical portion B' closely contacting an inner peripheral wall of the printing chamber 6 provided in the enclosed squeegee printing base A. A vertically movable cylindrical rotary portion C is mechanized on the vertically moving top lid portion B, mechanically driven on the vertically moving top lid portion B and one or more vertically movable rotary bars D are provided on the vertically movable cylindrical rotary portion C.

Further, as with the previous embodiment control means for accurately controlling action of the printing material (i.e. solder) in the printing chamber 6 by interlocking engagement of the above mechanisms. The printing chamber 6 is formed with a lower squeegee setting cassette 7 having a leading edge 7a and a trailing edge 7b and including a chamber opening stopper member X. The squeegee setting cassette 7 includes a V-shaped opening V designed to open and close when the squeegee is moved to make sliding contact with a screen plate 1 screen plate top surface 1a by provision of a printing base lower support portion 3 at a lower side corresponding to a screen plate lower surface 1b of the screen plate 1.

As with the first preferred embodiment, printing base lower support portion 3 receives the load applied to the printing chamber 6 for effecting screen printing operation.

The squeegee assembly 8 is formed with rigid material for further controlling pressure in the printing chamber 6. By utilizing such rigid squeegees 8, the pressure of the printing load is never applied directly to the screen plate 1. Because the printing load of the printing chamber 6 is not applied to the screen plate 1, damage to the screen plate 1 according to being subject to pressure is avoided. The printing load is applied to the screen plate only at a position at which the squeegee is brought into contact with the surface of the screen plate via the V-shaped printing opening V, this may be referred to as a secondary printing load. Further, the printing load may be adjusted according to the structure of the screen plate. Thus, substantially thin plate material may be used for forming the screen plate 1 allowing fine pitch high density printing to be realized.

Moreover, such control is also available in a case where a substantially thick screen plate 1 is utilized due to extrusion action carried out by the vertically moving top lid portion B. The lower cylindrical portion is provided at a top side of the printing chamber 6 and the vertically movable cylindrical rotary portion C having a vertically movable rotary bars D is provided at a lower side of the vertically movable body of vertically moving top lid portion B and one or more vertically movable rotary bars D are provided the vertically movable cylindrical rotary portion C to form a control mechanism for performing printing by controlling operation of these portions as necessary.

Further, control operation of the above portions is synchronized with opening and closing of the 8 provided at the lower side of the printing chamber 6 for effecting printing operation. For example, printing operations require closely timed actions such as kneading at the time of squeegee closing, supplying and kneading at the time of squeegee opening, and returning printing material at the time of starting of closing of the 8.

Since, according to the structure of the present invention the vertically moving top lid portion B sits sealingingly upon the enclosed squeegee printing base A acting as a piston and cylinder. Accordingly, sealing of the printing chamber printing chamber 6 is assured even with movement of the vertically moving top lid portion B. Further, according to such structure, pressure of the printing chamber printing chamber 6 may be precisely controlled and dispersion of the printing material is avoided thus allowing fine pitch high density printing to be realized with uniform thickness of a printed area. Further the chamber printing chamber 6 is sealed and can therefore be pressurized with an inert gas, such as nitrogen, for example, for preventing activation of the solder and promoting long term continuous printing operation by the apparatus.

According to the invention, the individually controlled vertically moving top lid portion B, vertically movable cylindrical rotary portion C, and vertically movable rotary bars D are provided in an integrated assembly based on the vertically moving top lid portion B which is set into the top of the enclosed squeegee printing base A as a single assembly, or cassette-like mechanism allowing such a screen printing apparatus to be compact and straight forward in design. Various combinations of the above components are possible within the scope of the invention as herein disclosed.

According to the present embodiment, it will be noted that a single power source may be tapped for providing power requirements for control operation of the enclosed squeegee printing base A, vertically moving top lid portion B, vertically movable cylindrical rotary portion C, and vertically movable rotary bars D via provision of appropriate interlocking or gearing mechanisms.

As may also be seen in FIG. 1B, the enclosed squeegee printing base A is provided with a supply port 5 in connection with a supply source 4 (i.e. a solder replenisher) to effect replenishment of the solder (or other printing material) according to requirements. It has been noted that the squeegees 8 are rigidly formed. A blade of such rigid squeegees 8 are made to be substantially sharp for effecting clean printing. However, alternatively, roller type squeegee may also be utilized according to the structure of the invention.

In addition, a heat exchange unit 20 is provided at an inner wall of the printing chamber 6 while a control unit therefor may be provided, for example, at an outer wall of the enclosed squeegee printing base A such that suitable control of the temperature of the solder may be effected.

Further, a gas control portion including a gas supply inlet 14 is provided for providing an inert gas such as nitrogen to the sealed chamber printing chamber 6 for preventing the solder from degrading with age such that long term continuous printing may be reliably consistent.

Further, since such high density, fine pitch printing operations must assure high quality, a squeegee control portion E may further be interlocked with the above described apparatus The squeegee control portion E may be attached to one side of the enclose squeegee printing base A and provided with a motor portion, or a squeegee control driving power unit EM similarly to the other portions or, as previously mentioned, a single power source may be tapped for providing required power for control operation of the enclosed squeegee printing base A, vertically moving top lid portion B, vertically movable cylindrical rotary portion C, , vertically movable rotary bars D and squeegee control portion E via provision of appropriate interlocking or gearing mechanisms.

Further, since monitoring and inspection of such fine pitch printing is required. A monitoring unit may further be attached downstream of a printing position since simultaneous printing and inspection are difficult for various reasons. The monitoring unit may be provided attached to the enclosed squeegee printing base A for carrying out inspection of a printed surface immediately after printing such that a feedback control means is provided for allowing continuous monitoring and adjustment of the printing characteristics.

Also, although electric motors are utilized according to the embodiment, it is alternatively possible to provide such a mechanism utilizing hydraulic pressure or air pressure, etc.

According to the structure of the solder printing apparatus as set forth above, new problems facing circuit component printing are solved. Among these are the problems of sealing and airtightness of a printing chamber 6, maintaining of the printing material in a deactivated state is assured by the gas control provisions, kneading and agitation of the printing material in synchronous operation with a printing cycle may be assured, a desired temperature of the printing chamber 6 may be reliably maintained and viscosity control of solder and the like is simplified as well as supplying and returning the material to and from the 4. In addition, fine adjustment of pressure, a charging quantity of printing material, hardness and shape control of printing and changing printing conditions as well as damage to a printing surface and the like may be optimized according to interlocking provision of the squeegee control portion E as set forth above.

Referring again to FIG. 1B, a profile of an essential portion of the apparatus of the embodiment is shown for explaining the screen printing method according to the invention. The drawing represents a cross-sectional view of the main component enclosed squeegee printing base A of the printing device along a printing direction P. In FIG. 1B, screen printing screen plate 1 is cooperated with an enclosed squeegee component enclosed squeegee printing base A. A vertically moving top lid portion B is provided which moves vertically relative the enclosed squeegee printing base A with sliding contact of an inner wall portion of the enclosed squeegee printing base A. A vertically movable cylindrical rotary portion C is provided, at the vertically moving top lid portion B which moves in a vertically sliding manner with contact of a lower cylindrical portion B' inner wall portions of the printing chamber 6. Vertically movable rotary bars D are disposed at the vertically movable cylindrical rotary portion C and are vertically movable relative to the vertically movable cylindrical rotary portion C and active to agitate and knead the printing material within the printing chamber 6 such that a required viscosity thereof may be maintained. Squeegees 8 are positioned at the lower side of the enclosure formed by the housing of the enclosed squeegee printing base A. This structure may be formed as a modular component such as a cassette type unit (i.e. the squeegee setting cassette 7).

Further, as seen in FIG. 1B, driving power units are provided for operating the above-described components. A motor, or enclosed squeegee printing base power unit AM is provided for the enclosed squeegee printing base A, while a top lid driving power unit BM is provided for the vertically moving top lid portion B, a rotary portion driving power unit CM controls operation of the vertically movable cylindrical rotary portion C. Similarly, a rotary bar driving power unit DM is provided for controlling moving operations of the vertically movable rotary bars D.

It will be noted that the vertically moving top lid portion B is movable along vertical housing guides 9 via guide shoes 10. a Referring now to FIG. 2 in which top view of the vertically moving top lid portion B and the vertically movable cylindrical rotary portion C are shown, a motor acting as the rotary bar driving power unit DM may be attached to an upper side to the vertically moving top lid portion B via installation bolts 15 or the like, a motor shaft G thereof being accommodated within the vertically movable cylindrical rotary portion C. Further, it will be noted that a driving motor setting base 16 is provided for the vertically moving top lid portion B.

It will further be noted from the drawings that a printing chamber 6 is defined at an inner wall portion of the enclosed squeegee printing base A. The printing chamber 6 receives the printing material, such as a conductive viscous compound (i.e. solder) for circuit printing, from a supply source 4 via a supply port 5.

According to this structure the rotary bar driving power unit DM of the vertically movable rotary bars D may be an agitator motor or the like for kneading and agitate the printing material to maintain favorable flow thereof Further the vertically movable rotary bars D may be controlled independently depending on an open or closed condition of the squeegee. Further, the vertically movable cylindrical rotary portion C is active to vertically move the vertically movable rotary bars D according to given operational conditions so as to knead, agitate and extrude the printing material during printing. The vertically moving top lid portion B of the enclosed squeegee printing base A supplies printing material to the printing chamber 6 through to the 1*a* of a screen plate 1 by peripherally contacting the inner wall of the printing chamber 6 and moving downward to the surface of the screen. After printing is completed the vertically moving top lid portion B is controlled to rise when the squeegee opens for returning excess printing material. In case of fine pitch high density printing the above described recovery means is effective to improve printing quality substantially since residue left on the screen plate can greatly deteriorate overall printing quality.

The vertically movable cylindrical rotary portion C is also controlled as described above.

The squeegee control portion E is controlled by an squeegee control driving power unit EM simultaneously and printing operation is carried out by controlling the vertically moving top lid portion B, vertically movable cylindrical rotary portion C, and vertically movable rotary bars D together with squeegee control portion E.

Moreover, in the present apparatus, the lower cylindrical portion of the vertically moving top lid portion B acts as a shut off chamber of the apparatus preventing leakage of the printing material.

The squeegee or squeegees 8 are set into a squeegee setting cassette 7 having a leading edge 7*a* and a trailing edge 7*b*. At a lower side of the printing chamber 6 the squeegee setting cassette 7 includes a chamber opening stopper member X thus preventing excessive pressure being applied to the screen plate 1. Further, the combination of the squeegee setting cassette 7, the printing chamber base support portion 3 and the chamber opening stopper member X with controlled movement of the squeegee blade assembly 8 assures precise control over printing quality.

Hereinbelow, a squeegee structure utilized by the printing method and apparatus of the invention will be described in detail.

Since very fine pitch circuit printing is required, a squeegee structure to be utilized according to the invention includes enclosed as well as open type structures. the squeegee blades utilized in an enclosed type arrangement are rigid having a very sharp edge and a thickness of, for example, 0.5 to 0.1 mm and having a width small enough to accommodate the shape of a printed strip to be printed thereby.

In the case such a squeegee blade structure is to be utilized in an open, or non-enclosed type squeegee blade assembly, the squeegee blade assembly 8 may be made of synthetic resin and have thickness of approximately 10 mm.

The squeegee blade structure disclosed herein offers the following solutions to the problems encountered in the art. The rigid blade portions at extreme lead and trailing edges of the squeegee blade assembly are formed of so-called memory alloy and heating means are included for selectively varying a shape of such leading and trailing edges. Also, a front, or leading edge portion of a blade assembly according to the invention includes a narrower, sharper blade for effecting improved dryness and uniformity of a surface of a substrate or other article to be printed. For realizing the above, different thicknesses of squeegee are superimposed and an indented front edge is provided. For addressing the problem of half pitch screens including a concave portion at which a different depth of printing is required, a squeegee blade, for example, a trailing edge blade of the superimposed, or multi-plate type squeegee according to the invention is formed of a shape memory allow and heating is applied thereto at a portion of the printing process at which the changed depth area occurs to vary the shape of the squeegee blade such that the deeper area may be printed with a thickness of printing material consistent with that of other areas of the printed article. The heating for effecting such shape variation of the squeegee blade is discontinued after printing thereof such that a first configuration thereof is regained substantially immediately after printing of the deeper portion. Such shape variation of projected portions of squeegee blade is effected to allow other portions of squeegee blades to effect printing and a plurality of squeegee blade edges is arranged to cover the entire printed area with selective application of shape variation to assure control over even very complex printing pattern requirements. Extremely hard and sharp rigid squeegee materials are employed for resisting the abrasive characteristics of such printing materials as may be employed in such screen printing operations such as fine pitch and half pitch circuit printing etc. Further, various combinations of the above features and techniques are proposed for accommodating specific printing operational requirements.

Figure 3A:
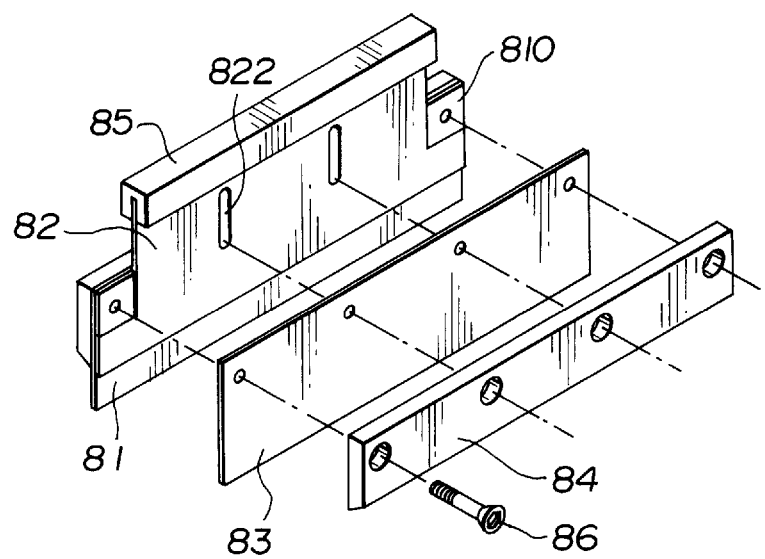
FIG. 3A is an exploded perspective view of a structure of a squeegee which may be utilized in the screen printing device of FIGS. 1 and 2.
Figures 3B, 3C:
FIGS. 3B and 3C are magnified profiles of different configurations of a squeegee blade which may be utilized in the blade assembly of FIG. 3A.

Referring now to FIG. 3A, 3B and 3C, a squeegee structure for screen printing according to the invention is configured such that a edge at front and rear sides of a squeegee assembly is formed of a rigid material having a substantially sharp edge (i.e. formed at an acute angle). Further, the squeegee blades according to the present embodiment may be movably adjust so as to change a tilt angle with relation to a contact surface of a print screen 1 as will be described in detail hereinlater.

FIGS. 3A is an exploded perspective view of a structure of a squeegee which may be utilized in the screen printing device of FIGS. 1 and 2;

FIGS. 3B and 3C are magnified profiles of different configurations of a squeegee blade which may be utilized in the blade assembly of FIG. 3A.

Figure 5:
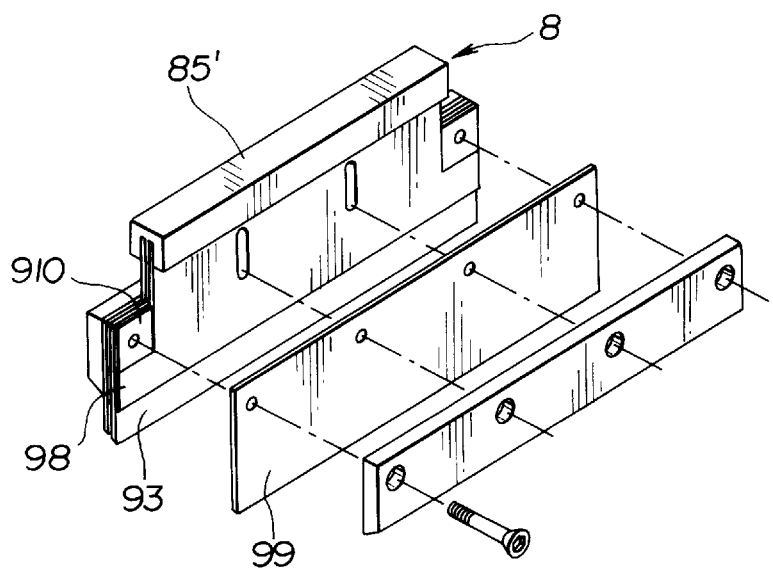
FIG. 5 is an exploded perspective view of a squeegee blade assembly according to a second preferred embodiment.

As may be seen in FIG. 5, a squeegee blade assembly 8 such as utilized in the above described enclosed type screen printing apparatus H is configured as a squeegee assembly including a (first) trailing edge squeegee blade 81 paired with a (second) leading edge squeegee blade 83 having a vertically displaceable cleaning blade 82 provided therebetween. The cleaning blade is mounted via a pair of parallel elongate grooves 822 for allowing vertical movement thereof. The blades 81–83 are retained between front and rear members of a squeegee block 84 which front and rear members may be joined via screws 86 or the like via aligned fastening holes 810 formed along an upper side of the squeegee blades 81, 83 so as to retain the blades therebetween. An upper side of the cleaning blade 82 is retained by a handle 85 which is retained by an appropriate control portion of a printing apparatus.

Referring to FIG. 3(B), according to the present embodiment, the trailing edge blade 81 is beveled on a side corresponding to a trailing direction of movement (i.e. printing direction P) and the leading edge blade 83 has a center pointed edge (i.e. beveled equally on front and rear sides thereof). However, alternatively, either of the above-described blade shapes may be utilized by either of the leading or trailing edge squeegee blades 81, 83.

Figure 4A:
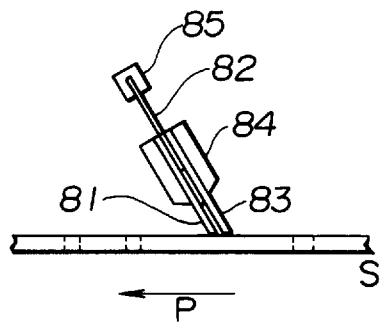
FIG. 4A, 4B and 4C show the squeegee blade assembly according to the first preferred embodiment during various stages of a printing operation.
Figure 4B:
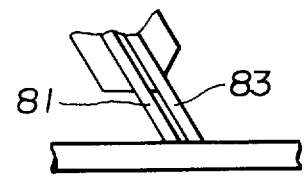
Figure 4C:
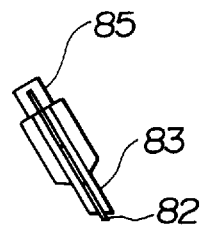

Referring now to FIG. 4(A), a cross-sectional side view of the squeegee assembly 8 is shown. As may be seen, the squeegee blades 81, 83 are brought into contact with a screen plate S under motion in the printing direction P. It will further be noted that leading and trailing edge blades 81, 83 are formed with single sided beveling so as to contact the surface of the screen plate S on a common plane. FIG. 4(B) shows the paralleled plate configuration of the blades 81, 83, the presence of the cleaning blade 82 disposed between the blades 81, 83 defines a gap between the blades. As seen in FIG. 4(C), after printing operation the blades are removed from contact with the screen plate S and the cleaning blade 82 is moved downwardly via control of the handle 85 so as to project from between the blades 81, 83 at lower sides thereof. According to this operation solder residue or other printing material may be completely removed from the squeegee blade assembly 8 so as to prevent hardening of the residue between the blades 81, 83 and thus a desirable resilience of the rigid squeegee blades 81, 83 may be retained during operation.

Referring now to FIGS. 5 and 6, an alternative embodiment of the squeegee blade assembly 8 according to the invention will be described hereinbelow.

As may be seen in FIG. 5 another configuration for squeegee blade assembly 8 such as utilized in the above described enclosed type screen printing apparatus H may be easily assembled with the base components of the above embodiment. According to the present example, the leading edge blade 83 is removed and replaced by additional components as will be described hereinbelow. An intermediate (third) squeegee blade 93 is placed adjacent the vertically displaceable cleaning blade 82 and a second cleaning blade 98 is mounted via a pair of parallel elongate grooves 822 (as in FIG. 3(A) for allowing vertical movement thereof and a leading edge blade 99 is then mounted adjacent the second cleaning blade 98 and the three blade structure of the present embodiment is assembled and retained by way of the squeegee block 84 which and the screws 86 or the like so as to retain the three blades 81, 93 and 99 therebetween. An upper side of the cleaning blades 82, 98 are retained by the handle 85 and controlled by an appropriate control portion of a printing apparatus. It will be noted that the handle 85 of the present embodiment is adapted so as to retain a plurality of cleaning blades in a paralleled plate arrangement similar to the disposition of the squeegee blades and vertically movable relative thereto.

Figure 6A:
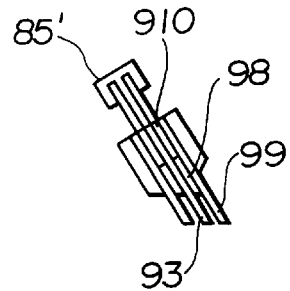
FIG. 6A and 6B show the squeegee blade assembly according to the second embodiment during various stages of a printing operation.
Figure 6B:
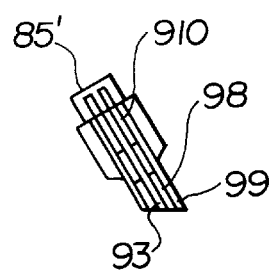

Referring to FIGS. 6(A) and (B) it will further be noted that the squeegee blades 81, 93 and 99 are formed with single sided beveling so as to contact the surface of the screen plate S substantially on a common plane. FIGS. 6(A) and (B) show the paralleled plate configuration of the multiple blades 81, 93, 99 and the cleaning blades 82, 92 disposed between the blades 81, 93 and 99 such that gaps are defined between each of the squeegee blades 81, 93, 99 when the cleaning blades 82, 92 are in a retracted, or vertically raised, position. As seen in FIG. 6(B), after printing operation the squeegee blade assembly 8 is removed from contact with the screen plate S and the cleaning blades 82, 92 are moved downwardly via control of the handle 85 so as to project from between the squeegee blades 81, 93, 99 at lower sides thereof. As in the above-described first embodiment, solder residue or other printing material may thus be completely removed from the squeegee blade assembly 8 so as to prevent hardening of the residue between the blades 81, 83 and a desirable resilience of the rigid squeegee blades 81, 83 is retained even during sustained continuous operation.

Figure 7:
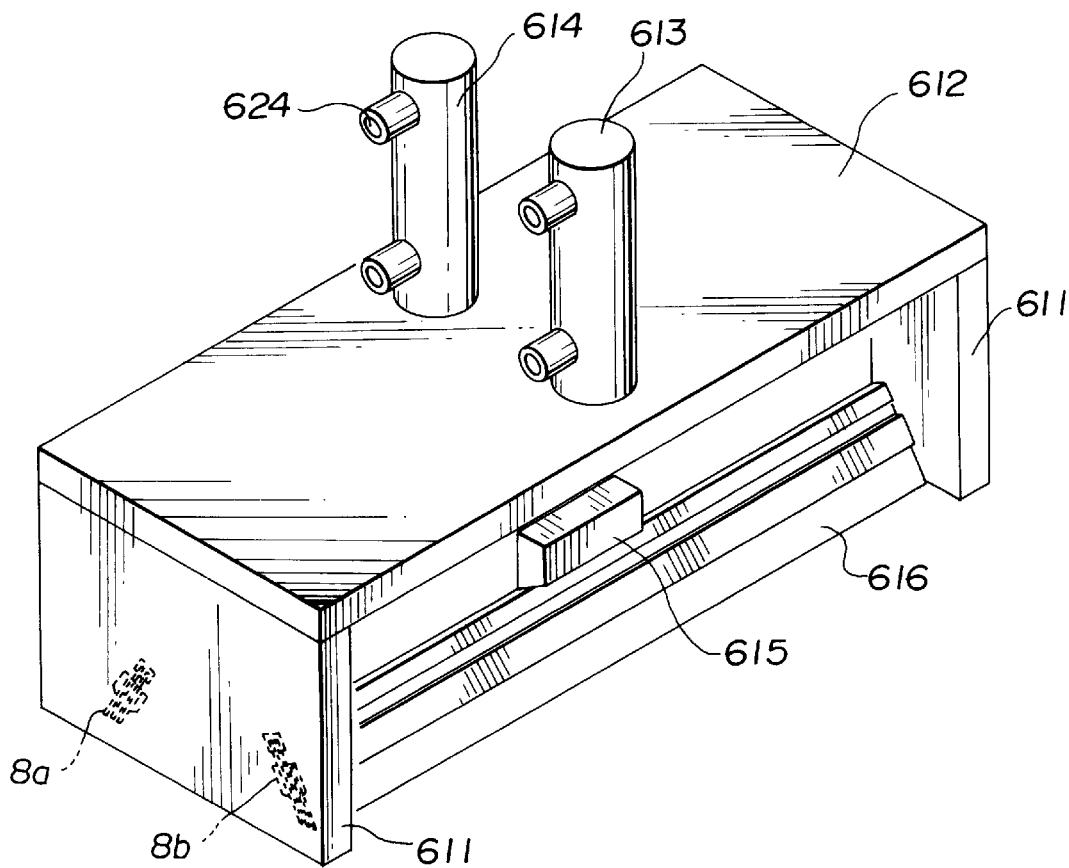
FIG. 7 is a perspective diagram of the paired squeegee according to the invention retained by a side plate structure.

Referring now to FIG. 7, a housing 612 for providing an enclosed squeegee blade assembly is shown. It will be noted that the above squeegee blade assembly 8 may be implemented in an open or enclosed configuration. However, the present squeegee blade arrangement 8 is conveniently adaptable for enclosed squeegee printing apparatus such as the enclosed type screen printing apparatus H described hereinabove.

According to the invention, such an enclosed squeegee blade assembly additionally comprises a horizontally disposed top plate 612 with attached side wall portions 611, 611 extending vertically from the top plate 612 substantially in parallel. The top plate is formed with a plurality of control cylinders 613, 614 accessible via a plurality of control ports 624, 624 . . . According to the present embodiment of a squeegee blade assembly 8, a pair of control cylinders 613, 614 are provided, respectively having a pair of control ports 624, 624. The control cylinders 613, 614 conduct driving power for the squeegee mechanism, via compressed gas or the like.

Figure 8A:
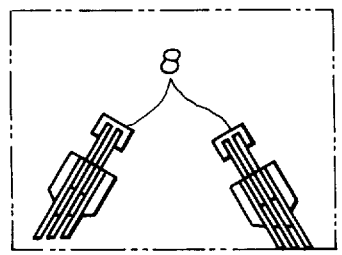
FIGS. 8A, 8B and 8C respectively represent ways in which the paired squeegee according to the invention may be mounted in an enclosure such as that of FIG. 7.
Figure 8B:
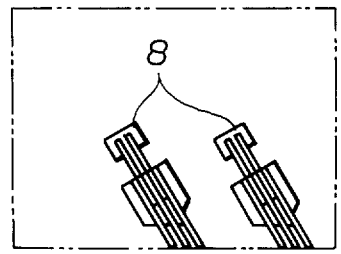
Figure 8C:
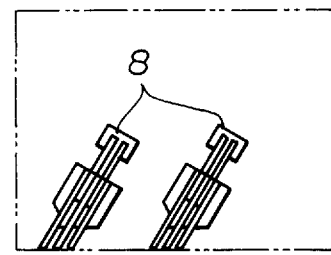

FIGS. 8(A), (B) and (C) show various mounting configurations of paired squeegee blade assemblies 8 according to the method of the invention which is facilitated according to the enclosed squeegee structure of the invention. Referring to FIG. 8(A) an arrangement in which two squeegee assemblies are mounted so as to be angled in opposing directions. That is, the leading (right side) assembly is angled downwardly in a direction opposite the printing direction P and the trailing assembly is angled downwardly in the printing direction P. FIG. 8(B) shows an arrangement wherein both assemblies are angled in parallel, in this case against the printing direction P. Then, in FIG. 8(C) an arrangement is shown in which the squeegees are angled in parallel in the printing direction. According to such mounting positions, various types of printing operations may be accomplished with high flexibility of the apparatus assuring that the best quality results are achieved.

The squeegee mounting is connected with drive means for allowing the direction of printing edge portions thereof to be varied, thus reciprocative printing may be easily accomplished.

Figure 9:
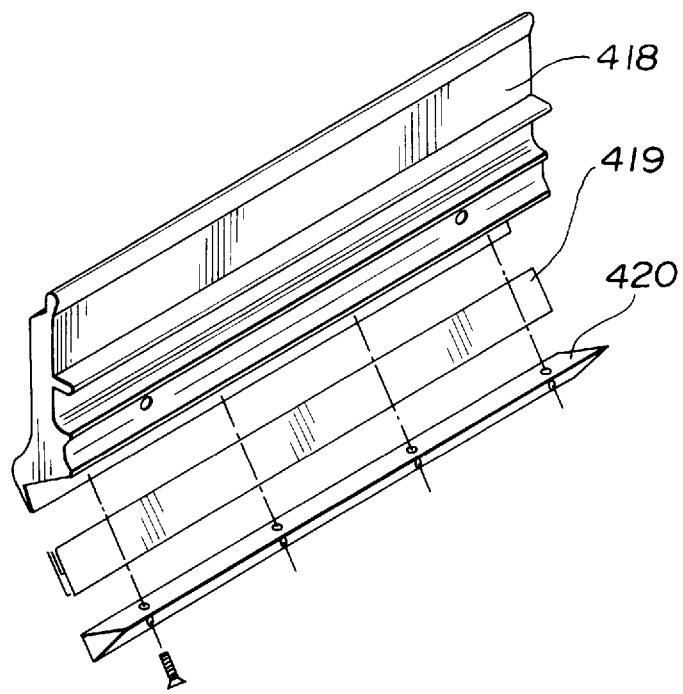
FIG. 9 is an exploded perspective view of an enclosed type squeegee according to the invention.

Referring now to FIG. 9, a paired squeegee blade portion according to the invention is shown. A movable base portion 418 is supported by the printing apparatus or within an enclosed housing and a paired squeegee 419 comprising a first printing edge and a second narrow blade is attached to a lower side of the base portion 418. Further, a support member 420 is provided for allowing secure mounting of the paired squeegee 419.

Figure 10:
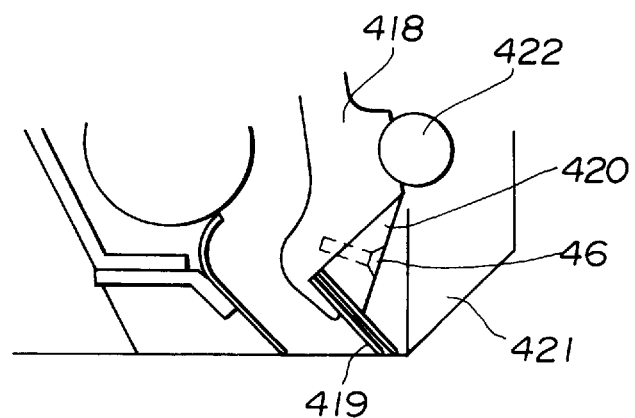
FIG. 10 is a side view of an enclosed type paired squeegee arrangement.

FIG. 10 shows a schematic view of the paired squeegee 419 of the invention mounted in an operational condition within an enclosed housing 421. A driving unit 422 is disposed at a front portion of the base portion 418 while a set screw 46 is used for securing the support member 420.

Figure 11:
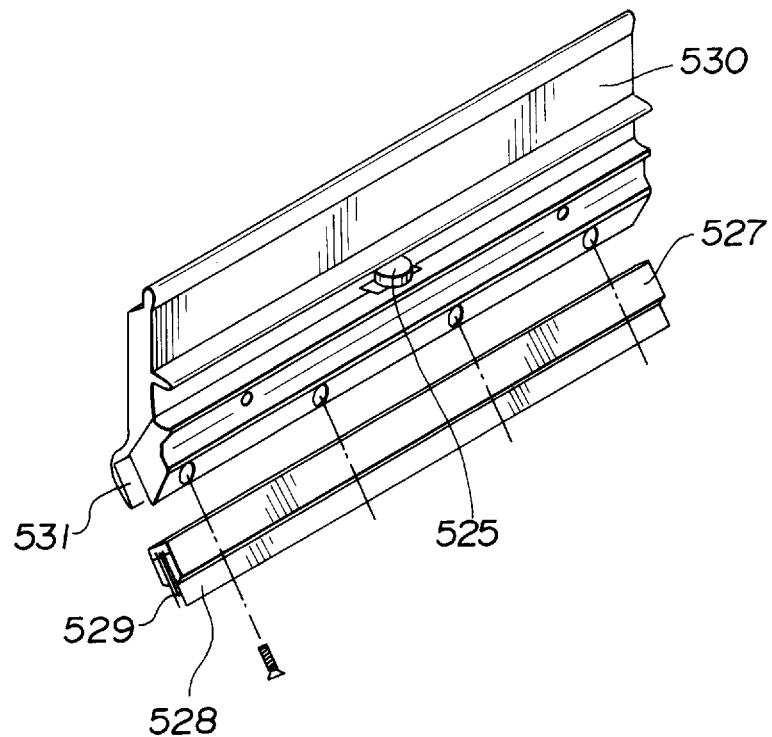
FIG. 11 is a perspective view of an alternate embodiment of the paired squeegee structure of the invention.

FIG. 11 shows an alternative embodiment of the a paired squeegee blade portion according to the invention. The movable base portion 530 has a paired squeegee 528 comprising paired printing edges and a lower profile edge 529 is attached to a lower side of the base portion 530. Further, the edge portions 528, 529 are mounted via a handle 527. In addition, according to the present embodiment. A hinge 525 is provided for connecting with driving means for allowing the lower profile edge 529 to be selectively extended and retracted, as seen in FIG. 12.

Figure 12:
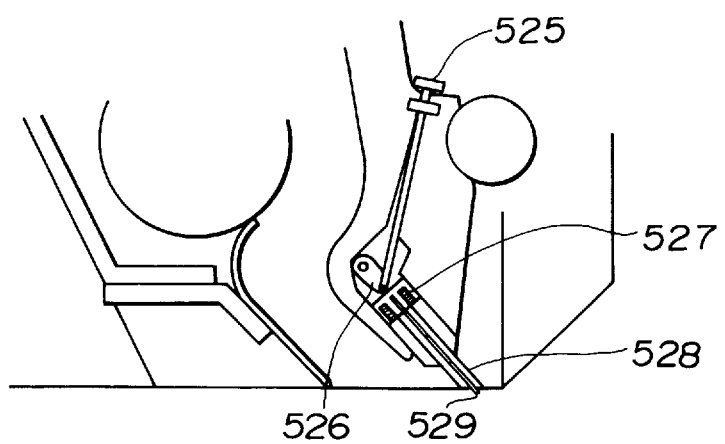
FIGS. 12 shows the alternative squeegee structure of FIG. 11 mounted in a paired squeegee enclosed type arrangement.
Figure 13:
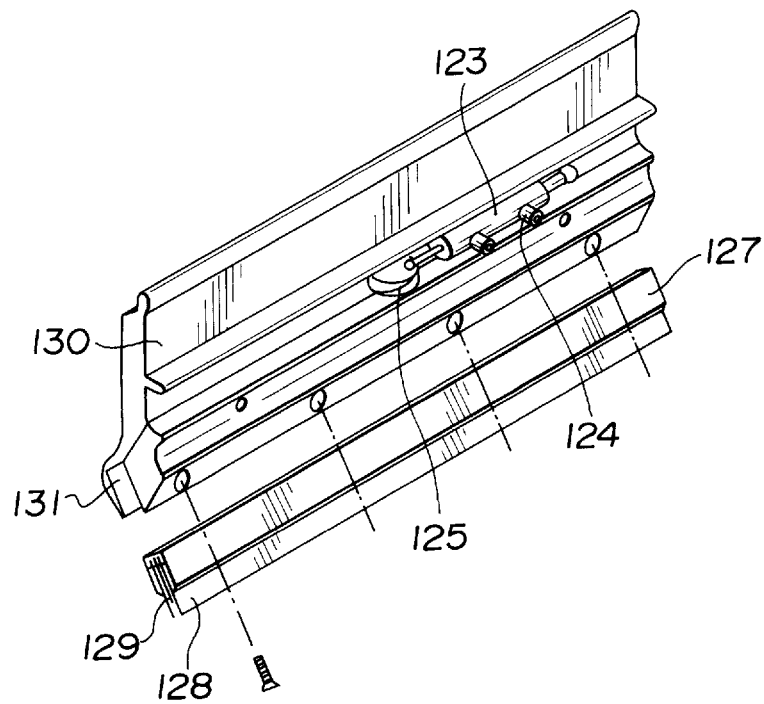
FIG. 13 is a third embodiment of the enclosed type squeegee structure according to the invention.

FIG. 12 shows a schematic view of the above arrangement mounted in an operational condition within an enclosed housing. The hinge 525 extends downwardly to a contact member 526 which contacts the handle 527 for urging the lower profile edge 529 selectively downward for printing concave portions of a screen plate (not shown). It will be noted that the lower profile edge may be of a different width than the printing edge for being selectively employed for printing only certain sections of the pattern being printed. According to this arrangement, mixed, or half pitch type printing may be easily accomplished with the same mechanism as utilized for normal printing.

FIG. 11 shows another embodiment of the a paired squeegee blade portion according to the invention. The movable base portion 130 has a paired squeegee 128 comprising paired printing edges and a lower profile edge 129 is attached to a groove 129 at the lower side of the base portion 130. Further, the edge portions 128, 129 are mounted via a handle 127. In addition, according to the present embodiment. A driving mechanism 125 is provided connecting a compressed gas outlet 123 from a supply line 124 to provided the compressed gas to the contact member form controlling movement of the squeegee. As with the previous embodiment, the lower profile edge may be selectively extended and retracted, as seen in FIG. 14.

Figure 14:
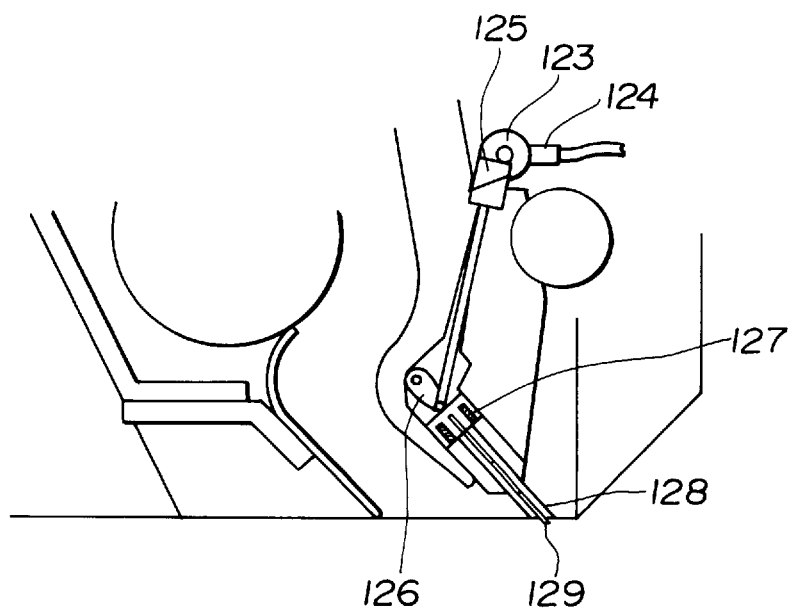
FIG. 14 shows the enclosed type squeegee structure according to the third embodiment in a paired squeegee arrangement.

FIG. 14 shows a schematic view of the above arrangement mounted in an operational condition within an enclosed housing. The hinge 525 extends downwardly to a contact member 526 which contacts the handle 527 for urging the lower profile edge 529 selectively downward for printing concave portions of a screen plate (not shown). It will be noted that the lower profile edge may be of a different width than the printing edge for being selectively employed for printing only certain sections of the pattern being printed. According to this arrangement, mixed, or half pitch type printing may be easily accomplished with the same mechanism as utilized for normal printing.

Figure 15A:
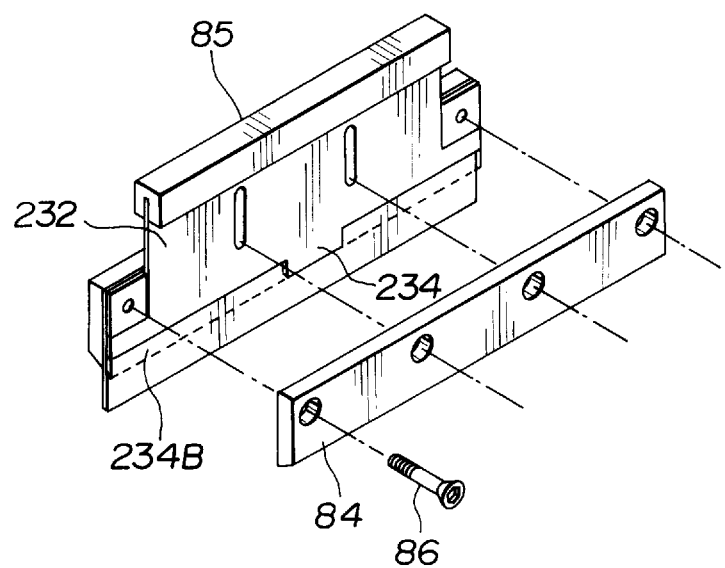
FIG. 15A is a perspective view showing another embodiment of a paired squeegee structure according to the invention.
Figure 15B:
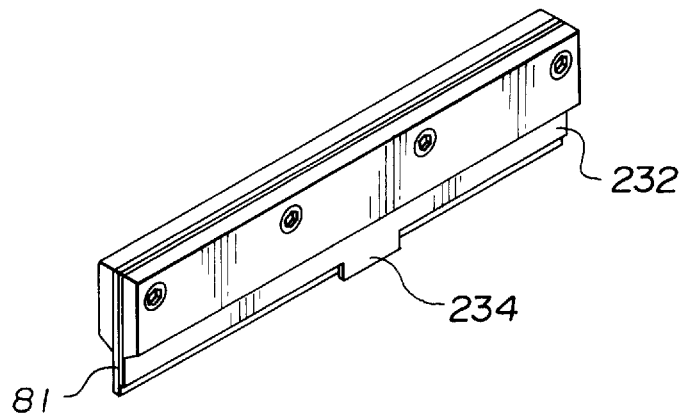
FIG. 15B shows a concave portion of the paired squeegee structure of FIG. 15A.
Figure 17:
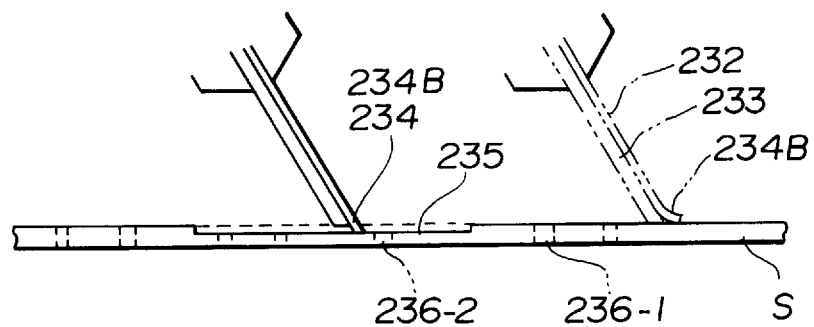
FIG. 17 is a side view of a paired squeegee arrangement during printing operation of a so-called half pitch irregular printing plate.

FIGS. 15(A) and 15(B) show alternative constructions for a single squeegee capable of printing half pitch patterns which may be provided in an enclosed or non-enclosed printing apparatus. According to this, a squeegee assembly 8 as previously described additionally is provided with a movable secondary blade 232 having narrow gauge printing edge 234. A flexible drape 234B may be included for providing a straight edge along the lower side of the secondary blade 232 and having enough 'give' such that the narrow gauge printing edge 234 may be easily inserted into a half pitch section of a screen plate as seen in FIG. 17. According to the present embodiment, the drape 234B is formed of shape memory alloy which is controlled to bend at a timing appropriate to half pitch printing intervals.

Figures 16A, 16B:
FIG. 16A and 16B show the paired squeegee structure of FIGS. 15A and 15B during a screen printing operation.

FIGS. 16(A) and 16(B) show the secondary blade 232 with the narrow gauge printing edge 234 in retracted and extended positions, respectively.

According to the above described arrangements, various possibilities for accomplishing various types of printing operations including complex half pitch type processing.

Figure 18:
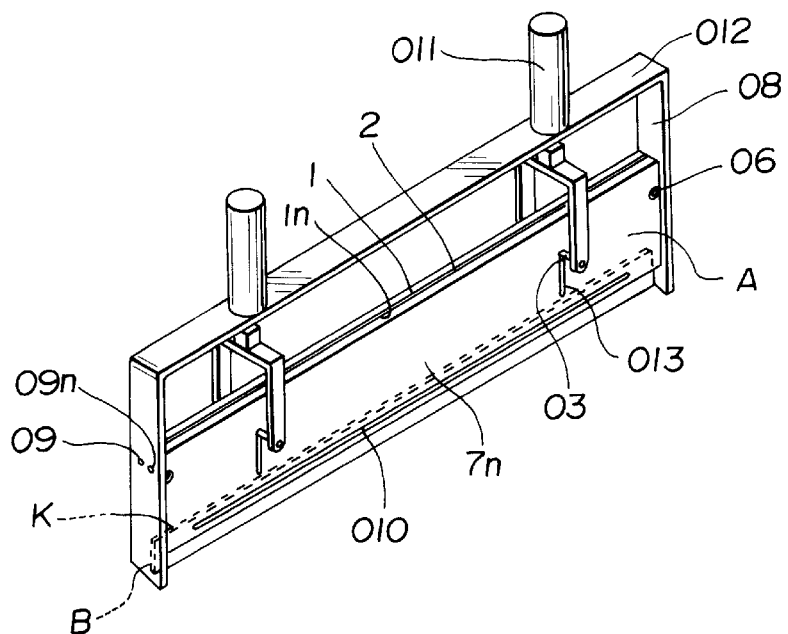
FIG. 18 shows another type of squeegee structure according to the invention.

Referring now to FIG. 18, further disclosure will be made utilizing the principles of the method and apparatus of the invention as described hereinabove for providing a squeegee assembly in which a highly flexible and accurate degree of control may be obtained over a plurality of squeegee blades in a single printing operation.

Figure 19A:
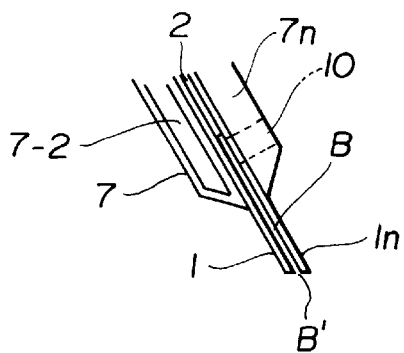
FIGS. 19A and 19B show cross-sectional views a plate portion of the squeegee structure of FIG. 18 during screen printing operation.
Figure 19B:
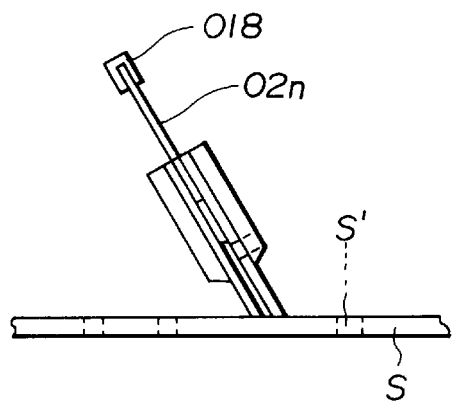

As may be seen in the drawing, a squeegee assembly according to the present embodiment includes a substantially square, or rectangular frame 012 having a plurality of substantially rectangular, blade plate portions 01–01n supported therewithin at an inner wall portion 08 and supported by screws 09–09n. A corresponding plurality of driven movable plates 02 (i.e. vertically movable) are disposed between the plate portions 01. The blade plate portions 01n have elongate vertical openings 013 formed therethrough and each of the movable plates 2 is provided with one or more control bars 03 projected perpendicularly therefrom to extend through the vertical openings 013. The control bars are associated with a control mechanism 011, such as servo motors, hydraulic cylinders, or the like, which clamp on either side of a single control bar 03n passed through the movable plate 02, according to the present embodiment. Additional screws 06 may be provided for maintaining accurate close spacing between the plate portions and the movable plates 02. Further, each blade plate portion 01n is formed with a elongate horizontal opening 010 therethrough along a lower side thereof. According to this arrangement, chambers B are defined in a space between the blade plate portions 01 enforced by the presence of the movable plates 02. According to the present structure, as seen in FIGS. 19(A) and 19(B), the assembly is retained by base plates 07 also having a horizontal opening 01 formed therethrough. According to this, as seen in FIG. 19(A) and (B), printing material may be introduced via the communicated openings 010 in a measured amount to the chamber B. The bottom edges of the blade plates are suitably shaped to act as printing squeegees and the movable plate 02 is controlled via a handle 018 to move up and down for forcing printing material in the chamber B downward to an outlet B' between the lower edges of the blade plate portion 01 so as to effect screen printing thereby. It will further be noted that in the case of printing circuits in which solder or the like is used as a printing material, the movable plates 02 may be randomly driven in a limited vertical motion for agitating the printing material for maintaining viscosity thereof.

According to this structure, agitating means, squeegee assembly and printing material storage are neatly combined in to a single sealed structure by which highly controlled printing may be effected by a substantially simple structure which is substantially sealed for maintaining a cleaner operational environment for such as delicate electronic circuit printing operations.

As may be seen in FIG. 20, various configurations for realizing a squeegee blade assembly 8 utilizing the features of the squeegee structure as set forth above. According to the present embodiment, the movable plates 02 are placed adjacent the blade plate portions 01 mounted via elongate grooves as set forth in relation to FIG. 3 and a plurality of such components may be assembled into a multi-blade structure retained by way of the based plates 07 similar to the squeegee block of the previous embodiment, so as to retain a plurality of blade plates 01 and movable plates 02 therebetween. An upper side of the movable plates 02 a handle 018 and controlled by an appropriate control portion of a printing apparatus.

According to the above, an exceedingly flexible printing method and apparatus is obtained. It will be noted that some of the movable plates 02 may be utilized as cleaning blades similarly to the previous embodiments, while others may be formed with narrow gauge blade portions 014 (FIGS. 20(E), 26) for effecting mixed pitch printing as described hereinbefore. Further, referring to FIG. 20(C), side brackets 019 have been adapted for accommodating such a multi-blade arrangement.

Figure 21A:
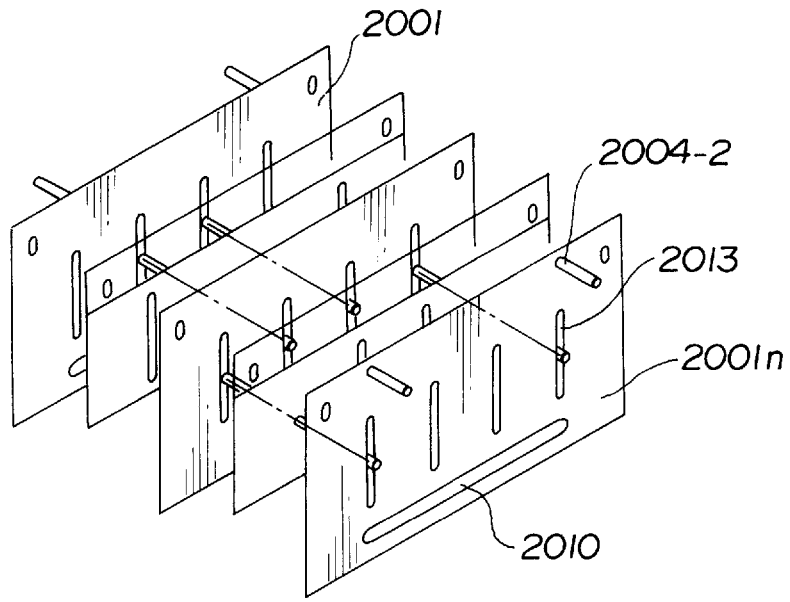
FIG. 21A is an exploded perspective view of an embodiment of a multi-plate squeegee structure according to the invention.
Figure 21B:
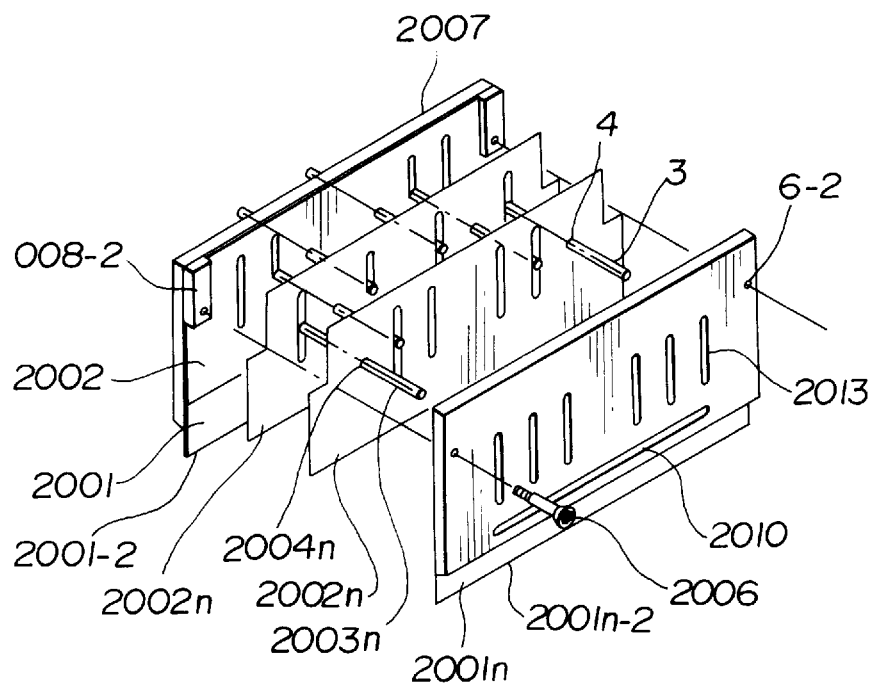
FIG. 21B is an exploded perspective view of the multi plate squeegee structure of FIG. 21 including mounting means therefor.

FIGS. 21(A), (B) and 22(A)–(D) and 23(A), (B) show various alternative constructions of such a multi-blade squeegee structure for screen printing.

It will be noted in the alternative constructions of FIG. 21(A) and(B) that connecting portions 04 are provided for each of the control bars 03 and corner spacers 08-1, 08-2 are provided for stably retaining such a multi-plate structure. Further, referring to FIG. 22(A)–(D), when assembled, outer plate top control bars 023–023*n* are projected from either side of the assembly so as to allow movable control of the entire unit.

Figure 22A:
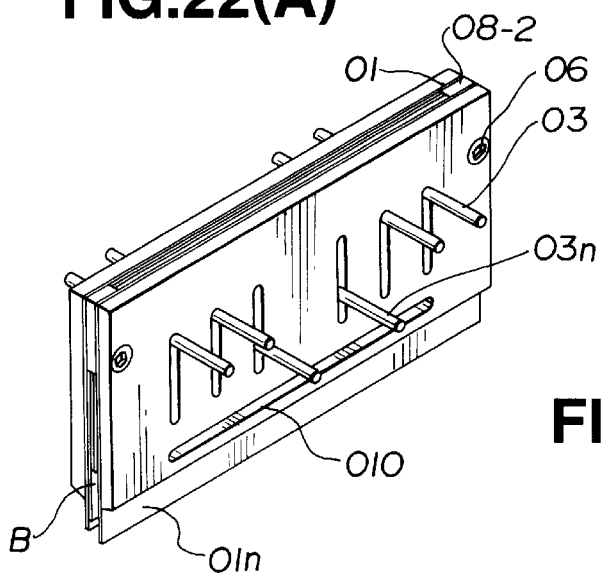
FIG. 22A is a squeegee assembly of a plate portion of the multi plate squeegee of FIGS. 21A and 21B.
Figure 22B:
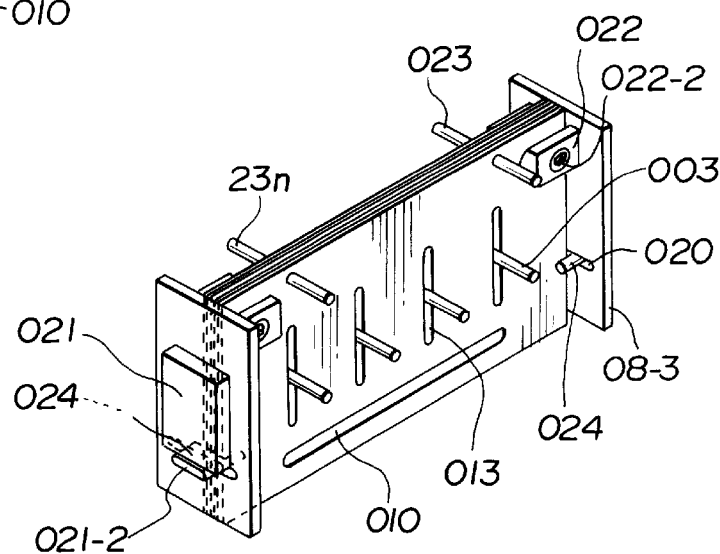
FIG. 22B shows the squeegee assembly of FIG. 22A including side portions thereof.
Figure 22C:
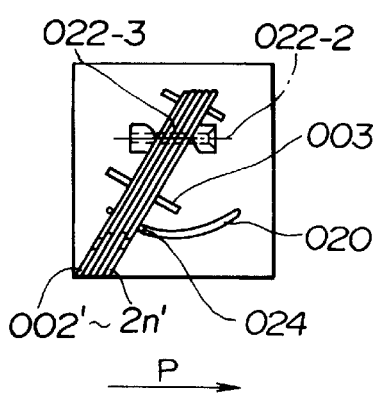
FIG. 22C and 22D are a cross-sectional side view of the multi plate squeegee structure of FIG. 22B mounted in two different directional orientations according to the invention.
Figure 22D:
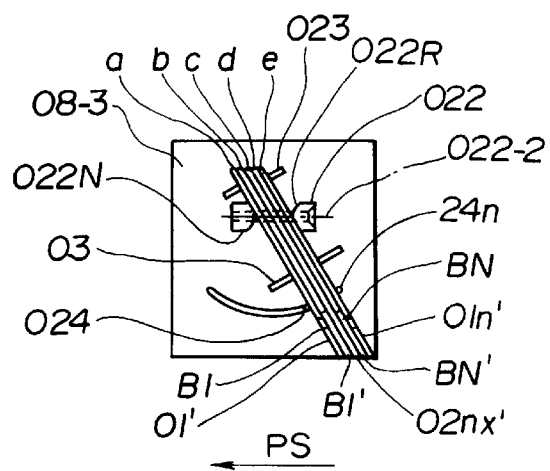

As seen in FIG. 22(B), side plates 08-3 are added to left and right sides of the plate assembly and side driving portions 021 are provided one or both outer sides of the plates 08-3. The driving means 021 and a retaining member 021-2 cooperatively guide side guide pins 024 within arcuate grooves 020 formed in one or both of the side plates 08-3. Further to this, the upper sides of the plates 01–02 are collectively retained at upper sides thereof by a fulcrum arrangement 022, 022-2 such that the angular disposition of the paralleled plates of the squeegee assembly may be controlled selectively.

Figure 23A:
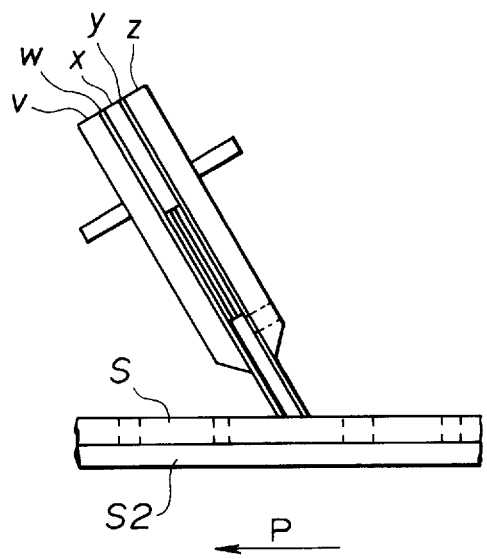
FIGS. 23A and 23B are side views of the multi-plate squeegee structure of the invention during screen printing operation.
Figure 23B:
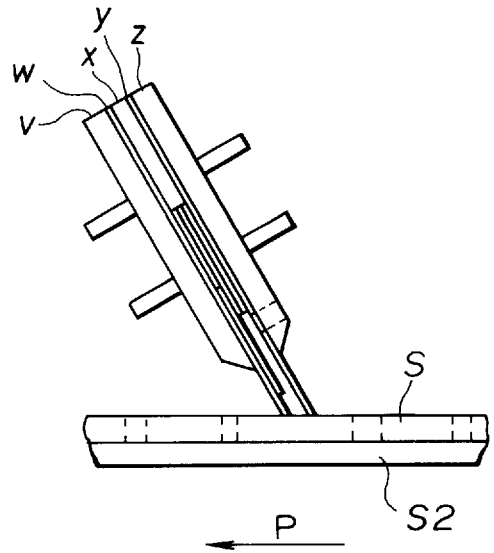

In operation, it may be seen in FIG. 23(A) a case in which a plurality of movable plates 02 between front and rear blade plate portions 01 (plates are marked with letters v, w, x, y, z . . . )is moved to an uppermost vertical movement position and printing material may thus be introduced to the chamber B. FIG. 22(B) shows a condition wherein the plurality of movable plates is driven randomly for agitating the printing material.

Figure 25A:
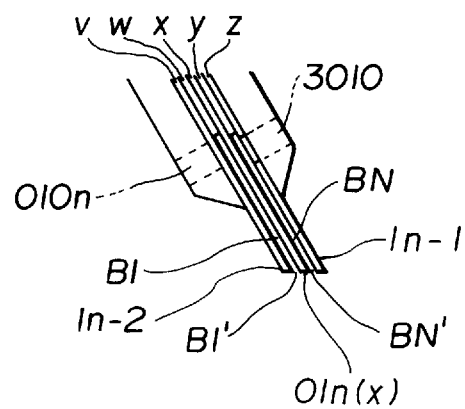
FIGS. 25A is a side view of a basic squeegee structure according to the invention.
Figure 25B:
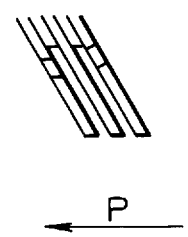
FIG. 25B shows an enlarged side view of a blade portion of the squeegee structure of FIG. 25 A.
Figure 24A:
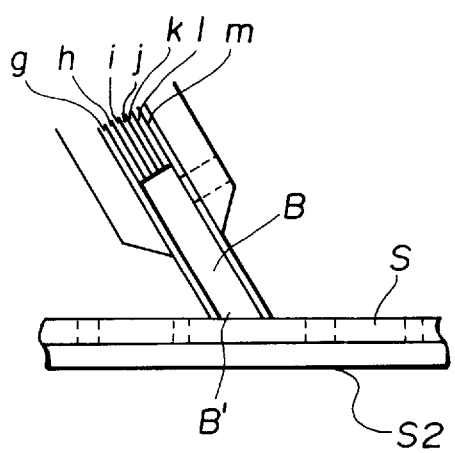
FIGS. 24A and 24B show cross-sectional side view of the multi plate squeegee of the invention during screen printing operation.
Figure 24B:
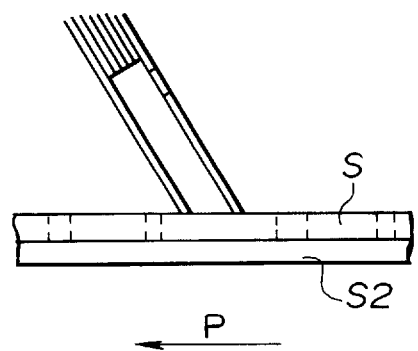
Figure 24C:
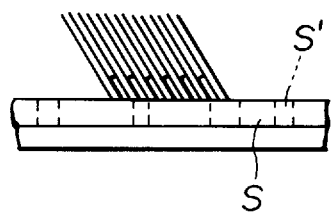
FIGS. 24C and 24D show another multi plate squeegee structure according to the invention during screen printing operation.
Figure 24D:
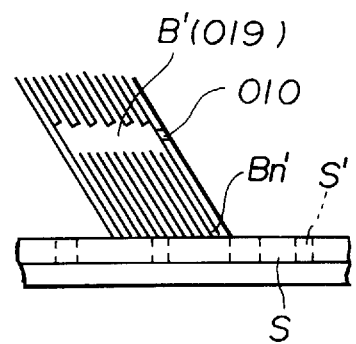
Figure 26:
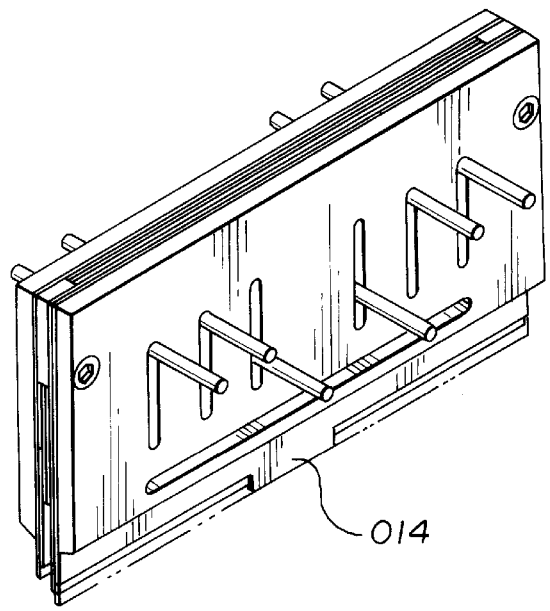
FIG. 26 shows an assembled view of a multi plate squeegee structure of the invention.
Figure 27A:
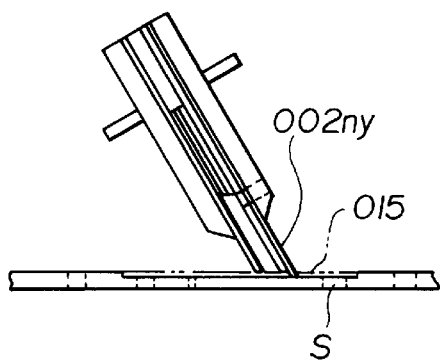
FIG. 27A and 27B show the multi plate squeegee of FIG. 26 during screen printing operation.
Figure 27B:
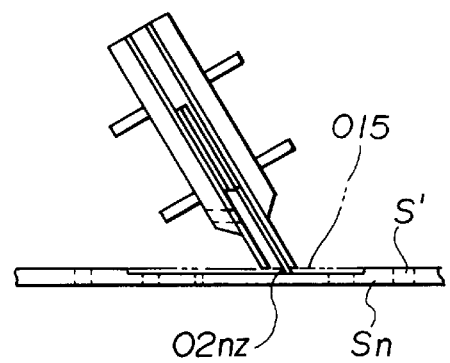

FIG. 24(A)–(D) also shows the various setups of blade plates 01 and movable plates 02 (marked with letters g, h, i, j, k, l, m . . . ) may be arranged for effecting different print, cleaning, mixed pitch printing, agitating, etc. FIGS. 24 and 25 show the various options available in a controlled printing environment such as disclosed herein. According to the invention a substantially compact, efficient and clean operation may be obtained. According to the apparatus as set forth above the chamber B may be divided in to an upper outlet B' and separate individual outlets B'n . . . for each blade. Accordingly, even very minute details, such as the depressions S' formed in the screen plate S on its base S2 may be exactly accommodated and efficiently printed. And according to provision of narrow gauge printing blades 014 such as herein disclosed, for example, as shown in FIGS. 26 and 27 (A), (B), mixed pitch printing operation wherein a recessed area 015 of a screen plate is to be printed, may be easily accomplished.

Figure 28A:
FIG. 28A to 28D show explanatory side view of blade configurations utilized in the multi plate squeegee structure according to the invention.
Figure 28B:
Figure 28C:
Figure 28D:

Referring now to FIGS. 28(A)–(D), the lower edges of the blade plate portions 1 (and/or the movable plates 02) may be configured in various ways according to desired printing characteristics etc. FIG. 28 (A) shows bluntly pointed edges 025 for the printing blades optimized for thick print operations while FIG. 28(B) illustrates printing blade edges 026 having a rounded configuration. Such rounded blade edges may be formed as shown in FIG. 28(C) wherein a single thickness of metal plate, for example, is bent double so as to produce a flexible yet strong, rounded printing blade 026*c*. FIG. 28(D) shows a sharply pointed blade edge 025*r* as described hereinabove in relation to the previous embodiments.

Thus, according to the present invention as described herein above, there is provided a screen printing apparatus having various advantages over the related art.

According to the screen printing apparatus of the invention, by utilizing such rigid squeegees 8, the pressure of the printing load is never applied directly to the screen plate 1. Because the printing load of the printing chamber 6 is not applied to the screen plate 1, damage to the screen plate 1 according to being subject to pressure is avoided. Further, the printing load may be adjusted according to the structure of the screen plate. Thus, substantially thin plate material may be used for forming the screen plate 1 allowing fine pitch high density printing to be realized.

Moreover, such control is also available in a case where a substantially thick screen plate 1 is utilized due to extrusion action carried out by the vertically moving top lid portion B.

Sealing of the printing chamber printing chamber 6 is assured even with movement of the vertically moving top lid portion B. Further, according to such structure, pressure of the printing chamber printing chamber 6 may be precisely controlled and dispersion of the printing material is avoided thus allowing fine pitch high density printing to be realized with uniform thickness of a printed area.

Further the chamber printing chamber 6 is sealed and can therefore be pressurized with an inert gas, such as nitrogen, for example, for preventing activation of the solder and promoting long term continuous printing operation by the apparatus.

The apparatus of the invention is formed as a single assembly, or cassette-like mechanism allowing such a screen printing apparatus to be compact and straight forward in design and various combinations of the components are possible.

Suitable control of the temperature of the solder may be effected according to provision of the temperature control portion and further, gas control including a gas supply inlet 14 is provided for providing an inert gas such as nitrogen to the sealed chamber printing chamber 6 for preventing the solder from degrading with age such that long term continuous printing may be reliably consistent.

A monitoring unit may further be interlocked with the above described apparatus for carrying out inspection of a printed surface immediately after printing such that a feedback control means is provided for allowing continuous monitoring and adjustment of the printing characteristics.

Further, according to the squeegee arrangement for screen printing which may be utilized by the screen printing apparatus as set forth herein printing problems arising from necessity of printing fine pitch and mixed print patterns may be solved. Also the squeegee structure according to the invention may be implemented in an enclosed or open type assembly.

According to the squeegee arrangement as set forth above, a squeegee made of a shape memory alloy stores the shape of a squeegee blade corresponding to a shape of a screen printing plate for printing a particular pattern. Moreover, the squeegee blade is integrated with a heating unit so that the shape can be controlled correspondingly to a printing surface by changing a temperature of the squeegee during printing operations. As set forth above, various types of changes and controlled may be implemented offering a substantially high level of control.

As for the problem of mixed patterns and high density, fine pitch screen printing, according to the screen printing method of the invention a rigid, very sharp edged blade is utilized at leading and trailing edges of the squeegee assembly, which is applicable for use on either mesh type screen printing plates or for thin metal screen printing plates having a pattern to be printed defined therethrough. The temperature control means of the invention being active to adjust an angle of contact between the squeegee blade and the printing plate in a direction opposite a printing direction to allow the squeegee blade to slide substantially smoothly over the contact surface of the screen printing plate.

Further, the present invention realized a squeegee structure which offers not only a horizontal printing surface, but also offers means for removing a printing residue during operation of the printing apparatus such that continuous high quality printing may be realized with less wear and abrasion being subjected to both the screen printing plate and to the squeegee blades themselves. Thus reliability, consistency, print quality and reduced maintenance operation are all assured. In addition, since the leading edge of the squeegee assembly according to the invention has a razor-like quality imparted by virtue of the sharp edged rigid structure thereof, a oil film residue commonly left according to use of conventional printing material may be removed and printing errors and flaws are reduced.

Since the assembly provides a plurality of squeegee blades, it is possible to form a width of a rearward one or more of the blades with a width dimension greater than that of a forward one or more of the squeegee blades such than the narrower blades may be inserted into indentations in a printing plate for printing specific portions of a final print. The narrower squeegee blades being withdrawn from the indentations of the printing plate in a controlled manner according to passage of the wider squeegee blades a timing after passage of the narrower blades. Also, highly controlled printing functions are possible by utilizing the method of the invention as applied to the disclosed squeegee blade by previously storing a concave, or projection configuration within a squeegee blade, or a portion thereof and activating said stored portion during screen printing operation via the temperature control portion. Further the squeegee blade of the invention may be provided in a hollow recess between a pair of paralleled plates. The squeegee blade portion being controllable to project from between the paralleled plates for effecting printing operation.

Further, according to the above described structure, vertical movement of a group of said parallel squeegees may be controlled cooperatively for designating a selected one or more of said squeegees as a printing squeegee. Thus arrangements may be provided in a single squeegee assembly such that even extremely complex printing patterns may be realized in one printing pass.

It will be noted that, although the preferred embodiment is set forth in terms of a screen printing method and apparatus applied to solder printing of electronic circuits, the present invention may be embodied in various different ways without departing from the principle of the invention as herein set forth.

The present invention in not limited only to the description as herein disclosed but may be modified and embodied in other ways without departing from the scope or inventive concept of the invention as set forth above.

What is claimed is:

1. A screen printing apparatus for applying a viscous printing material in a desired pattern on a substrate, the screen printing apparatus comprising:

a printing material chamber having a peripheral wall for containing the viscous printing material, the printing chamber having open ends and an inlet through the peripheral wall for supplying the printing material to the chamber;

an operable and closable squeegee mechanism at a first one of the open chamber ends;

a reversible displacement mechanism for extruding the printing material through the open squeegee mechanism, the displacement mechanism having an extrusion member for fitting in a second one of the open chamber ends; and an agitating mechanism for agitating the printing material in the chamber, the agitating mechanism being supported in the chamber by the extrusion member;

wherein operations of the displacement mechanism, the squeegee mechanism, and the agitating mechanism are synchronized with respect to one another.

2. The screen printing apparatus as claimed in claim 1, wherein the agitating mechanism comprises a rotary member carried by and rotatable with respect to the displacement mechanism.

3. The screen printing apparatus as claimed in claim 2, wherein the rotary member carries at least one agitating bar for agitating the printing material.

4. The screen printing apparatus as claimed in claim 1, wherein the peripheral wall of the printing material chamber includes a heat exchange unit.

5. The screen printing apparatus as claimed in claim 1, further comprising:

a port for supplying inert gas to the printing material chamber.

6. The screen printing apparatus as claimed in claim 1, wherein the squeegee mechanism comprises a fixed edge with respect to the printing material chamber and a movable edge which can be displaced with respect to the fixed edge.

7. The screen printing apparatus as claimed in claim 1, wherein the extrusion member closes the inlet.

8. The screen printing apparatus as claimed in claim 1, wherein the squeegee mechanism closes the inlet.

9. The screen printing apparatus as claimed in claim 1, wherein an agitating operation of the agitating mechanism and an opening or closing operation of the squeegee mechanism are synchronized with respect to one another.

10. The screen printing apparatus as claimed in claim 1, wherein an agitating operation of the agitating mechanism, an extruding operation of the displacement mechanism, and an opening operation of the squeegee mechanism are synchronized with respect to one another.

11. The screen printing apparatus as claimed in claim 1, wherein a printing material returning operation of the displacement mechanism and a closing operation of the squeegee mechanism are synchronized with respect to one another.

* * * * *